United States Patent
Shimomura et al.

(10) Patent No.: US 11,862,698 B2
(45) Date of Patent: Jan. 2, 2024

(54) SEMICONDUCTOR DEVICE AND METHOD OF MANUFACTURING SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Saya Shimomura, Komatsu Ishikawa (JP); Hiroaki Katou, Nonoichi Ishikawa (JP); Toshifumi Nishiguchi, Hakusan Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 213 days.

(21) Appl. No.: 17/473,622

(22) Filed: Sep. 13, 2021

(65) Prior Publication Data

US 2022/0293755 A1 Sep. 15, 2022

(30) Foreign Application Priority Data

Mar. 9, 2021 (JP) ................. 2021-037198

(51) Int. Cl.
*H01L 29/423* (2006.01)
*H01L 29/40* (2006.01)
(Continued)

(52) U.S. Cl.
CPC ........ *H01L 29/4236* (2013.01); *H01L 29/401* (2013.01); *H01L 29/407* (2013.01); *H01L 29/66734* (2013.01); *H01L 29/7813* (2013.01)

(58) Field of Classification Search
CPC ............. H01L 29/7813; H01L 29/4236; H01L 29/407
See application file for complete search history.

(56) References Cited

U.S. PATENT DOCUMENTS 9,825,167 B2 11/2017 Matsuura et al.
9,917,183 B2 * 3/2018 Arai ................. H01L 29/41
(Continued)

FOREIGN PATENT DOCUMENTS

CN 110190124 A * 8/2019 ........... H01L 21/266
JP 2012-164916 A 8/2012
(Continued)

OTHER PUBLICATIONS

Yasuo Wada, et al., "Grain Growth Mechanism of Heavily Phosphorus-Implanted Polycrystalline Silicon", J. Electrochem. Soc., Solid-State Science and Technology, vol. 125, No. 9, 1978, pp. 1499-1504.
(Continued)

*Primary Examiner* — Joseph C. Nicely
(74) *Attorney, Agent, or Firm* — Allen & Overy LLP

(57) ABSTRACT

A semiconductor device of embodiments includes a first electrode, a second electrode, a first semiconductor region, a second semiconductor region, a third semiconductor region, a conductive portion, a first insulating portion, a gate electrode, a second insulating portion, and a third insulating portion. The first to third semiconductor regions are provided between the first electrode and the second electrode. The conductive portion includes a first conductive portion and a second conductive portion on the second electrode side and having a lower impurity concentration than the first conductive portion. The first insulating portion is provided between the first conductive portion and the first semiconductor region. The gate electrode is provided between the second semiconductor region and the second conductive portion. The second insulating portion is provided between the second conductive portion and the gate electrode. The third insulating portion is provided between the second semiconductor region and the gate electrode.

12 Claims, 23 Drawing Sheets

(51) Int. Cl.
*H01L 29/66* (2006.01)
*H01L 29/78* (2006.01)

(56) References Cited

U.S. PATENT DOCUMENTS

| | | | |
|---|---|---|---|
| 2012/0199899 | A1 | 8/2012 | Kobayashi et al. |
| 2014/0077278 | A1* | 3/2014 | Nozu .................. H01L 29/7813 |
| | | | 257/773 |
| 2014/0284709 | A1 | 9/2014 | Shimomura et al. |
| 2016/0268420 | A1* | 9/2016 | Arai ........................ H01L 29/41 |
| 2018/0224495 | A1 | 8/2018 | Takeuchi |
| 2019/0259873 | A1 | 8/2019 | Yamanobe et al. |
| 2020/0273978 | A1 | 8/2020 | Ohno et al. |

FOREIGN PATENT DOCUMENTS

| | | |
|---|---|---|
| JP | 2013-069852 A | 4/2013 |
| JP | 2014-187237 A | 10/2014 |
| JP | 6008377 B2 | 10/2016 |
| JP | 2018-129358 A | 8/2018 |
| JP | 2019-145701 A | 8/2019 |
| JP | 2020-136587 A | 8/2020 |

OTHER PUBLICATIONS

R.B. Marcus, et al., "Polysilicon/SiO2 Interface Microtexture and Dielectric Breakdown", J. Electrochem. Soc., Solid-State Science and Technology, vol. 129, No. 6, 1982, pp. 1282-1289.

Kuniyuki Hamano, "Properties and Applications of Polycrystalline Silicon" Denki kagaku, Electrochemical Society of Japan, Jul. 5, 1982. With machine translation.

Takao Yamamoto, et al., "Analysis of dynamic avalanche phenomenon in SOI lateral high speed diode during reverse recovery and proposal of novel device structure suppressing the dynamic avalanche", Electronic Device Research Group Materials The institute of Electrical Engineers of Japan, Electronic Device, Nov. 29, 2010.

* cited by examiner

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2021-037198, filed on Mar. 9, 2021, the entire contents of which are incorporated herein by reference.

FIELD

Embodiments described herein relate generally to a semiconductor device and a method of manufacturing a semiconductor device.

BACKGROUND

Semiconductor devices, such as a metal oxide semiconductor field effect transistor (MOSFET), are used as switching elements. In semiconductor devices, it is required to suppress the occurrence of breakdown or reduce the resistance during the ON operation.

DETAILED DESCRIPTION

Figure 1A:
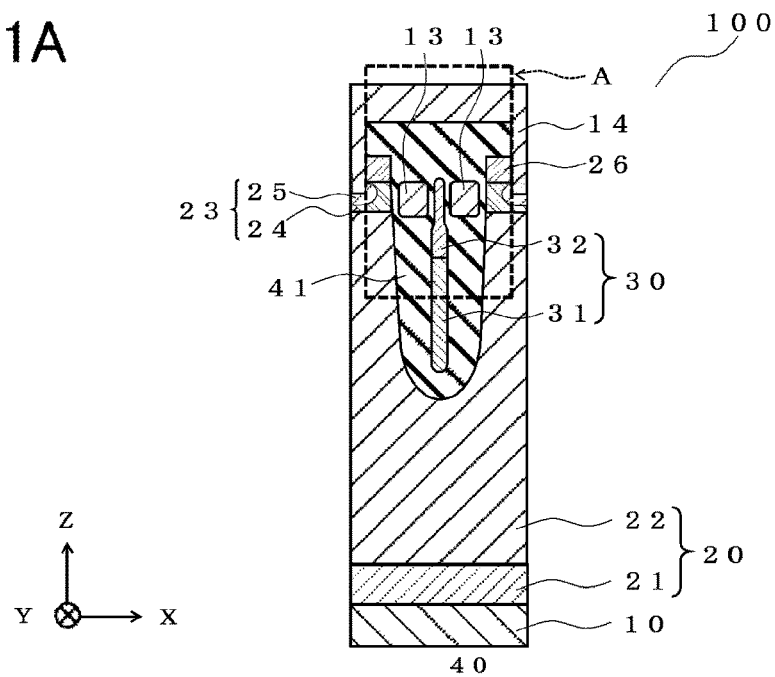
FIG. 1A is a cross-sectional view of a semiconductor device according to a first embodiment.

A semiconductor device of embodiments includes: a first electrode; a second electrode; a first semiconductor region of a first conductive type provided between the first electrode and the second electrode and electrically connected to the first electrode; a plurality of second semiconductor regions of a second conductive type provided between the first semiconductor region and the second electrode; a third semiconductor region of the first conductive type provided between the second semiconductor region and the second electrode and electrically connected to the second electrode; a conductive portion provided between the first electrode and the second electrode, the conductive portion including a first conductive portion and a second conductive portion, the first conductive portion provided on a side of the conductive portion facing the first electrode in a first direction from the first electrode to the first semiconductor region, the second conductive portion provided on a side of the conductive portion facing the second electrode in the first direction, the second conductive portion disposed between the second semiconductor regions in a second direction crossing the first direction, and the second conductive portion having an impurity concentration lower than an impurity concentration of the first conductive portion; a first insulating portion provided between the first conductive portion and the first semiconductor region; a gate electrode provided between the second semiconductor region and the second conductive portion in the second direction; a second insulating portion provided between the second conductive portion and the gate electrode; and a third insulating portion provided between the second semiconductor region and the gate electrode.

In addition, a method of manufacturing a semiconductor device of embodiments includes: forming a trench in a first semiconductor region of a first conductive type from a surface of the first semiconductor region in a first direction; forming a first insulating portion on a surface of the trench; forming a first conductive portion on the first insulating portion in the trench; forming a second conductive portion in contact with the first conductive portion and having an impurity concentration lower than an impurity concentration of the first conductive portion, the first conductive portion being disposed between the first insulating portion and the second conductive portion in the first direction; removing a part of the first insulating portion to expose a part of the second conductive portion and a part of an inner wall of the trench in a second direction crossing the first direction; forming a second insulating portion by oxidizing a surface of the second conductive portion; forming a third insulating portion by oxidizing the inner wall of the exposed trench; forming a gate electrode between the second insulating portion and the third insulating portion; forming a second semiconductor region of a second conductive type facing the gate electrode in the first semiconductor region, the third insulating portion interposed between the second semiconductor region and the gate electrode in the second direction; and forming a third semiconductor region of the first conductive type between the surface and the second semiconductor region.

Hereinafter, embodiments will be described with reference to the diagrams. In this description, the same portions are denoted by the same reference numerals throughout the diagrams. In addition, the dimensional ratio of each diagram is not limited to the ratio shown in the diagram. In addition, the present embodiment does not limit the invention.

First Embodiment (Structure of Semiconductor Device 100)

Figure 1B:
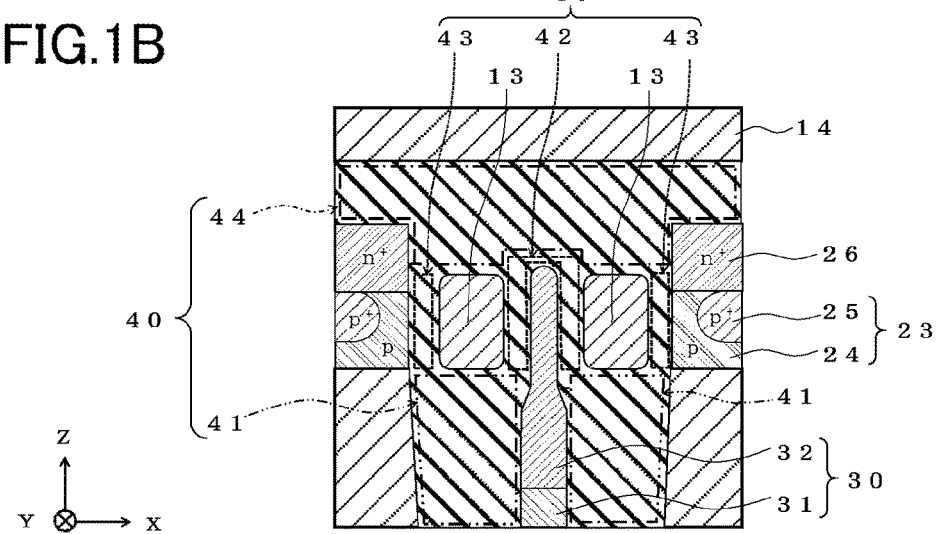
FIG. 1B is a cross-sectional view showing a chain line A portion of FIG. 1A.
Figure 1C:
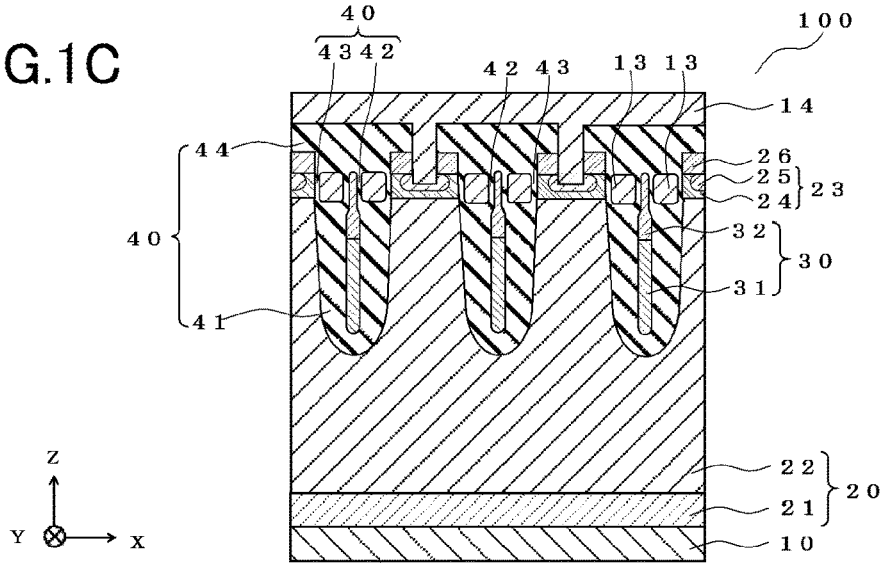
FIG. 1C is a cross-sectional view of the semiconductor device according to the first embodiment.
Figure 2A:
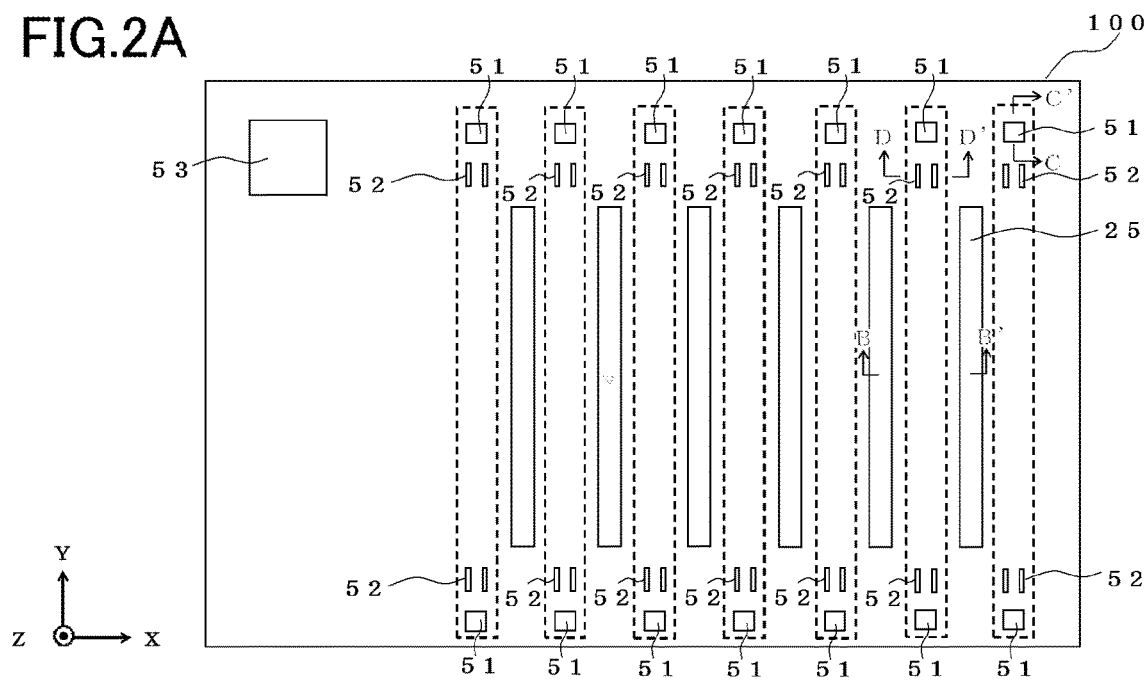
FIG. 2A is a plan view of the semiconductor device according to the first embodiment.
Figure 2B:
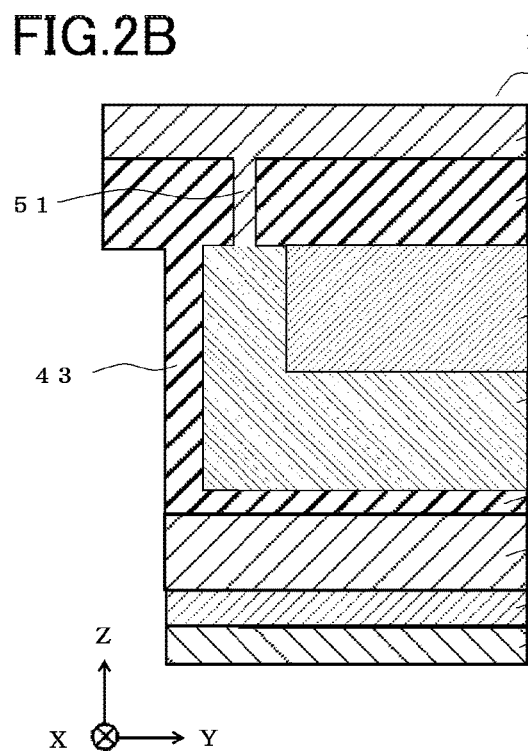
FIG. 2B is a cross-sectional view taken along the line C-C' of FIG. 2A.
Figure 2C:
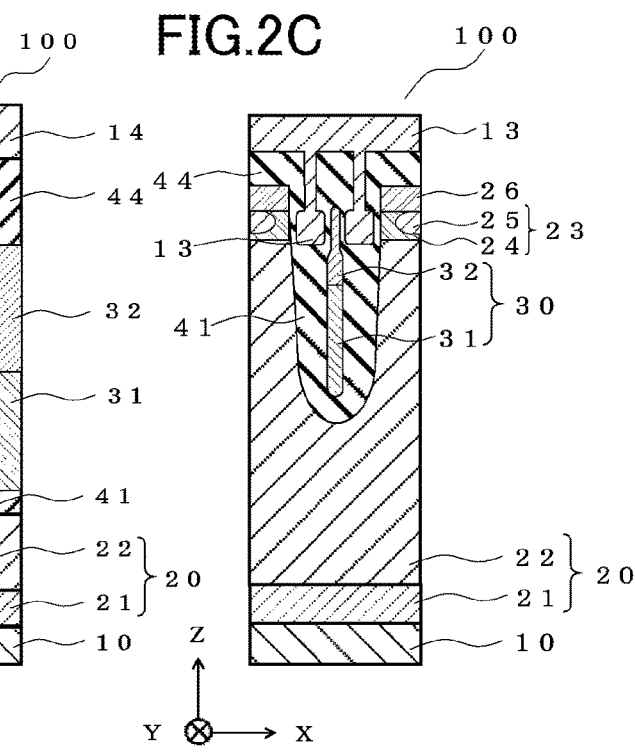
FIG. 2C is a cross-sectional view taken along the line D-D' of FIG. 2A.

The detailed structure of a semiconductor device 100 according to a first embodiment will be described with reference to FIGS. 1A, 1B, 1C, 2A, 2B, and 2C. FIG. 1A is a cross-sectional view of the semiconductor device 100 according to the first embodiment, FIG. 1B is a cross-sectional view showing a chain line A portion of FIG. 1A, and FIG. 1C is a cross-sectional view of the semiconductor device 100 according to the first embodiment. FIG. 2A is a plan view of the semiconductor device 100 according to the first embodiment, FIG. 2B is a cross-sectional view taken along the line C-C' of FIG. 2A, and FIG. 2C is a cross-sectional view taken along the line D-D' of FIG. 2A.

Hereinafter, a case where the first conductive type is n type and the second conductive type is p type will be described as an example. In addition, in the following description, the notations of $n^+$, n, $n^-$, $p^+$, p, and $p^-$ indicate the relative high and low of the impurity concentration in each conductive type. That is, $n^+$ indicates that the n-type impurity concentration is relatively higher than n, and $n^-$ indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, $n^+$-type and $n^-$-type may be simply described as n-type, $p^+$-type and $p^-$-type may be simply described as p-type.

The impurity concentration in the semiconductor region can be measured by, for example, time of flight-secondary ion mass spectrometry (TOF-SIMS). In addition, the relative high and low of the impurity concentration can be determined from, for example, the high and low of the carrier concentration obtained by scanning capacitance microscopy (SCM). In addition, the distance such as the depth and thickness of an impurity region can be calculated by, for example, the TOF-SIMS. In addition, the distance such as the depth, thickness, and width of an impurity region and a distance between impurity regions can be calculated from, for example, a composite image of an SCM image and an atomic force microscope (AFM) image.

In addition, the concentration of impurities contained in an insulating layer can be measured by, for example, energy dispersive X-ray spectroscopy (EDX).

The semiconductor device 100 according to the first embodiment shown in FIGS. 1A, 1B, and 1C is a MOSFET. The semiconductor device 100 includes a drain electrode 10 (first electrode), a gate electrode 13, a source electrode (second electrode), a first semiconductor region of n-type 20, a second semiconductor region of p-type 23, a third semiconductor region of $n^+$-type 26, a conductive portion 30, and an insulating layer 40.

The direction from the drain electrode 10 to the first semiconductor region of n-type 20 is assumed to be a Z direction (first direction). In addition, the direction perpendicular to the Z direction is assumed to be an X direction (second direction). In addition, the direction perpendicular to the X and Z directions is assumed to be a Y direction (third direction). FIGS. 1A, 1B, and 1C show cross-sectional views of the semiconductor device 100 on the XZ plane. In addition, although the X, Y, and Z directions are shown in a relationship in which the X, Y, and Z directions are perpendicular to each other in the present embodiment, the X, Y, and Z directions are not limited to being perpendicular to each other and may be in a relationship in which the X, Y, and Z directions cross each other. In addition, for the sake of explanation, the direction from the drain electrode 10 to the first semiconductor region of n-type 20 is referred to as "up", and the opposite direction is referred to as "down".

The first semiconductor region of n-type 20, the second semiconductor region of p-type 23, and third semiconductor region of $n^+$-type 26 contain silicon (Si) or silicon carbide (SiC) as a semiconductor material. When silicon is used as a semiconductor material, arsenic (As), phosphorus (P), or antimony (Sb) can be used as an n-type impurity. Boron (B) can be used as a p-type impurity.

The first semiconductor region of n-type 20 has an $n^+$-type drain region 21 and an $n^-$-type drift region 22. The $n^+$-type drain region 21 is provided on the drain electrode 10 and is electrically connected to the drain electrode 10. The $n^-$-type drift region 22 is provided on the $n^+$-type drain region 21 in the Z direction. The $n^-$-type drift region 22 is electrically connected to the drain electrode 10 through the $n^+$-type drain region 21.

The second semiconductor region of p-type 23 has a p-type base region 24 and a $p^+$-type contact region 25. A plurality of second semiconductor regions of p-type 23 are provided. A plurality of p-type base regions 24 are spaced from each other in the X direction. The p-type base region 24 is provided on the $n^-$-type drift region 22. The $p^+$-type contact region 25 is provided on each p-type base region 24. The third semiconductor region of $n^+$-type 26 is an $n^+$-type source region. The third semiconductor region of $n^+$-type 26 is provided on the p-type base region 24.

FIG. 1B is an enlarged cross-sectional view of a region shown by the chain line A portion of FIG. 1A.

The insulating layer 40 has a first insulating portion 41, a second insulating portion 42, a third insulating portion 43, and a fourth insulating portion 44. In FIG. 1B, the first insulating portion 41 is shown by a two-dot chain line, the second insulating portion 42 and the third insulating portion 43 are shown by a chain line, and the fourth insulating portion 44 is shown by a one-dot chain line. The first insulating portion 41, the second insulating portion 42, the third insulating portion 43, and the fourth insulating portion 44 are integrally formed. The insulating layer 40 contains an insulating material such as silicon oxide. The first insulating portion 41, the second insulating portion 42, the third insulating portion 43, and the fourth insulating portion 44 may contain impurities (for example, boron). The specific structure of the insulating layer 40 will be described later.

The conductive portion 30 and the gate electrode 13 contain a conductive material such as polysilicon. Impurities such as phosphorus are added to the conductive material. The conductive portion 30 is provided between the drain electrode 10 and the source electrode 14. The conductive portion 30 is a field plate electrode. The conductive portion 30 has a first conductive portion 31 and a second conductive portion 32. The first conductive portion 31 is provided in the $n^-$-type drift region 22. The first insulating portion 41 is provided between the first conductive portion 31 and the $n^-$-type drift region 22. The first conductive portion 31 is provided on the drain electrode 10 side of the conductive portion 30 in the Z direction. The second conductive portion 32 is provided on the first conductive portion 31. The lower portion of the second conductive portion 32 is provided in the $n^-$-type drift region 22. The first insulating portion 41 is provided between the lower portion of the second conductive portion 32 and the $n^-$-type drift region 22. The upper portion of the second conductive portion 32 is provided in the $n^-$-type drift region 22. The second insulating portion 42 is provided between the upper portion of the second conductive portion 32 and the $n^-$-type drift region 22. The second conductive portion 32 is provided closer to the source electrode 14 than the first conductive portion 31 in the Z direction. The second conductive portion 32 is provided on the source electrode 14 side of the first conductive portion 31 in the Z direction. The impurity concentration in the second conductive portion 32 is lower than the impurity concentration in the first conductive portion 31. The first insulating portion 41 is a field plate insulating film. The first insulating portion 41 is provided between the first conductive portion 31 and the first semiconductor region 20. The first insulating portion 41 is provided between the lower portion of the second conductive portion 32 and the first semiconductor region 20. The first insulating portion 41 insulates the conductive portion 30 from the gate electrode 13, the first semiconductor region 20, the second semiconductor region 23, and the third semiconductor region 26. The second insulating portion 42 insulates the conductive portion 30 from the gate electrode 13, the first semiconductor region 20, the second semiconductor region 23, and the third semiconductor region 26. The gate electrode 13 is provided on the first insulating portion 41. The specific structure in the vicinity of the gate electrode 13 will be described later.

The source electrode 14 is provided on the $n^+$-type source region 26 and the $p^+$-type contact region 25. The source electrode 14 is electrically connected to the conductive portion 30, the $n^+$-type source region 26, and the $p^+$-type contact region 25. The fourth insulating portion 44 is provided between the gate electrode 13 and the source electrode 14. The gate electrode 13 and the source electrode 14 are electrically separated from each other by the fourth insulating portion 44.

As shown in FIGS. 1A and 1B, the gate electrode 13 is provided between the p-type base region 24 and the second conductive portion 32 in the X direction. The gate electrode 13 is provided between the $n^+$-type source region 26 which is provided on the p-type base region 24 and the second conductive portion 32 in the X direction. The third insulating portion 43 is provided between the p-type base region 24 and the gate electrode 13 and between the $n^+$-type source region 26 and the gate electrode 13. The p-type base region 24 and the gate electrode 13 are electrically separated from each other by the third insulating portion 43. The $n^+$-type source region 26 and the gate electrode 13 are electrically separated from each other by the third insulating portion 43. The second insulating portion 42 is provided between the gate electrode 13 and the second conductive portion 32. The gate electrode 13 and the second conductive portion 32 are electrically separated from each other by the second insulating portion 42.

In addition, as shown in FIGS. 1A, 1B, and 1C, a plurality of gate electrodes 13 may be provided. In this case, the other gate electrode 13 is provided between the second conductive portion 32 and the p-type base region 24 different from the p-type base region 24 described above. In addition, the other gate electrode 13 is provided between the second conductive portion 32 and the $n^+$-type source region 26 different from the $n^+$-type source region 26 described above. The second insulating portion 42 is provided between the second conductive portion 32 and the gate electrode 13, and the second conductive portion 32 and the other gate electrode 13 are electrically separated from each other by the second insulating portion 42. The third insulating portion 43 is provided between the other gate electrode 13 and the p-type base region 24. In addition, the third insulating portion 43 is provided between the other gate electrode 13 and the n⁺-type source region 26.

As described above, the semiconductor device 100 shown in FIGS. 1A, 1B, and 1C has a structure in which the p-type base region 24 (or the n⁺-type source region 26), the third insulating portion 43, the gate electrode 13, the second insulating portion 42, the second conductive portion 32, the second insulating portion 42, the gate electrode 13, the third insulating portion 43, and the p-type base region 24 (or the n⁺-type source region 26) are arranged in this order in the X direction. In addition, in the semiconductor device 100, the above-described structure is repeatedly provided in the X direction as shown in FIG. 1C.

FIG. 2A shows a plan view of the semiconductor device 100, and the source electrode 14 shown in FIGS. 1A, 1B, and 1C are omitted. In addition, a boundary portion between the p-type base region 24 (or the n⁺-type source region 26) and the third insulating portion 43 is shown by a chain line. As shown in FIG. 2A, the p⁺-type contact region 25 extends in the Y direction. Similarly to the p⁺-type contact region 25, each region provided in the semiconductor device 100, for example, each of the p-type base region 24, the n⁺-type source region 26, the conductive portion 30, and the gate electrode 13 extends in the Y direction.

In addition, in the cross section taken along the line B-B' of FIG. 2A, the semiconductor device 100 has a structure shown in FIG. 1A. The region having a structure shown in FIG. 1A is an element region through which a current flows. In a part of the semiconductor device 100, a gate pad 53 connected to an external power supply (or a gate controller) is provided so as to be spaced from the element region. The region which surrounds the element region and through which no current flows is called a termination region. The semiconductor device 100 has an element region and a termination region. A gate wiring is electrically connected to the gate pad 53. The gate wiring is the gate electrode 13 disposed on the fourth insulating portion 44 in FIG. 2C. The gate wiring is electrically separated from the source electrode 14. The gate wiring is provided on the surface of the semiconductor device 100.

The cross-sectional view taken along the line C-C' of FIG. 2A is FIG. 2B. The conductive portion 30 extending in the Y direction is electrically connected to the source electrode 14 through the source contact portion 51 in the termination region of the semiconductor device 100. The conductive portion 30 is in contact with the source contact portion 51. The source contact portion 51 is in contact with the source electrode 14. The conductive portion 30 is electrically pulled out to the surface side of the semiconductor device 100 by the source contact portion 51, thereby being electrically connected to the source electrode 14.

In addition, the cross-sectional view taken along the line D-D' of FIG. 2A is FIG. 2C. The gate electrode 13 extending in the Y direction is electrically connected to the gate wiring (that is, the gate pad 53) through a gate contact portion 52 in the termination region of the semiconductor device 100. The gate electrode 13 is electrically pulled out to the surface side of the semiconductor device 100 by the gate contact portion 52, thereby being electrically connected to the gate wiring (that is, the gate pad 53).

In addition, in the present embodiment, the source contact portion 51 is disposed closer to the termination region of the semiconductor device 100 than the gate contact portion 52. The positions where the source contact portion 51 and the gate contact portion 52 are formed can be changed by appropriately changing the design of the gate electrode 13 and the second conductive portion 32. The gate contact portion 52 may be disposed closer to the termination region than the source contact portion 51.

(Operation of Semiconductor Device 100)

The operation of the semiconductor device 100 will be described.

First, a turn-on operation will be described. With a positive voltage applied to the drain electrode 10, a voltage equal to or more than a threshold voltage is applied to the gate electrode 13. Therefore, a channel (inversion layer) is formed in the p-type base region 24 adjacent to the gate electrode 13 with the third insulating portion 43 interposed therebetween, and the semiconductor device 100 is turned on. Electrons flow from the source electrode 14 to the drain electrode 10 through the channel. That is, when the semiconductor device 100 is in the on state, the current flows from the drain electrode 10 to the source electrode 14.

Next, a turn-off operation will be described. When a voltage lower than the threshold voltage is applied to the gate electrode 13, the channel in the p-type base region 24 disappears and the semiconductor device 100 is turned off.

When the semiconductor device 100 is switched to the off state, the positive voltage applied to the drain electrode 10 increases. On the other hand, a negative voltage (for example, ground) relative to the drain electrode 10 is applied to the source electrode 14. As a result, from the interface between the n⁻-type drift region 22 and the first insulating portion 41 provided around the conductive portion 30 serving as a field plate electrode, a depletion layer spreads toward the n⁻-type drift region 22. Due to the spread of the depletion layer, electric field concentration in the n⁻-type drift region 22 is suppressed, so that it is possible to increase the breakdown voltage of the semiconductor device 100. In addition, due to the spread of the depletion layer, the n-type impurity concentration in the n⁻-type drift region 22 is increased while maintaining the breakdown voltage of the semiconductor device 100, so that it is possible to reduce the on-resistance of the semiconductor device 100.

(Method of Manufacturing Semiconductor Device 100)

FIGS. 3A to 10B are process cross-sectional views showing a manufacturing process of the semiconductor device 100 according to the first embodiment. An example of the method of manufacturing the semiconductor device 100 according to the first embodiment will be described with reference to FIGS. 3A to 10B.

Figure 3A:
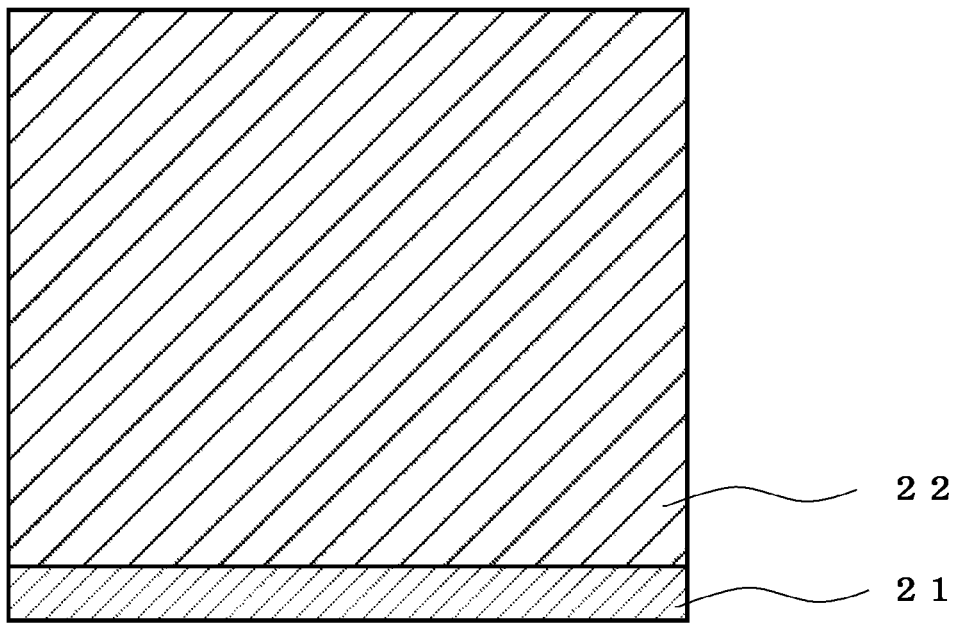
FIG. 3A is a cross-sectional view showing a method of manufacturing the semiconductor device according to the first embodiment.

First, an n⁺-type semiconductor substrate 21 is prepared. The semiconductor substrate 21 is the n⁺-type semiconductor region 21. As shown in FIG. 3A, by epitaxial growth on the n⁺-type semiconductor region 21 in the Z direction, the n⁻-type semiconductor region 22 is formed. In addition, the n-type impurity concentration in the n⁻-type semiconductor region 22 is, for example, equal to or more than $1 \times 10^{15}$ cm⁻³ and equal to or less than $1 \times 10^{16}$ cm⁻³.

Figure 3B:
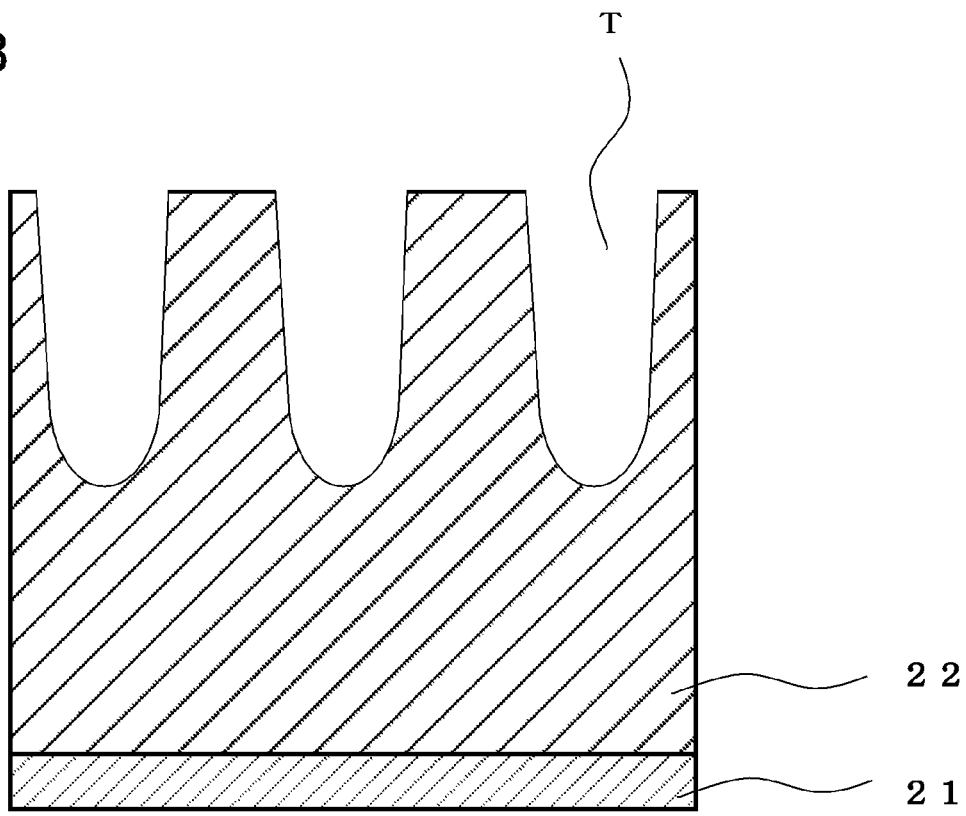
FIG. 3B is a cross-sectional view showing a method of manufacturing the semiconductor device according to the first embodiment.

As shown in FIG. 3B, a plurality of trenches T extending along the Y direction are formed on the upper surface of an n⁻-type semiconductor region 1a by reactive ion etching (RIE).

Figure 4A:
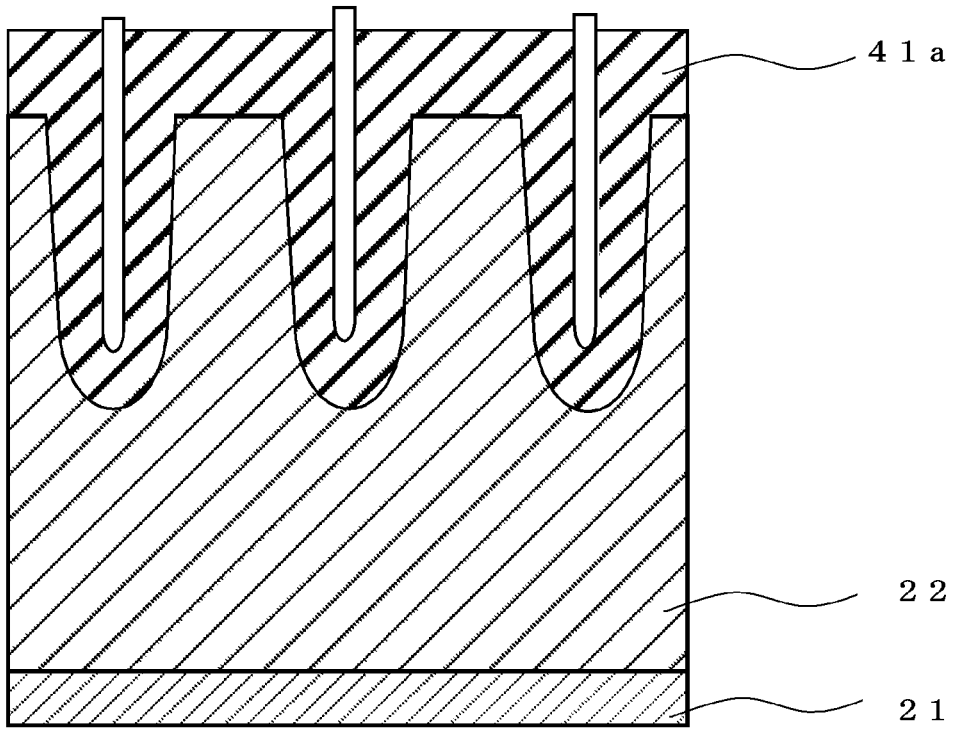
FIG. 4A is a cross-sectional view showing a method of manufacturing the semiconductor device according to the first embodiment.

As shown in FIG. 4A, a first insulating layer 41a is formed along the upper surface of the n⁻-type semiconductor region 22 and the inner surface of the trench T. The first insulating layer 41a is formed by thermally oxidizing the n⁻-type semiconductor region 22. Alternatively, the first insulating layer 41a may be formed by depositing the first insulating layer 41a by a chemical vapor deposition method (CVD method). The first insulating layer 41a contains silicon oxide.

Figure 4B:
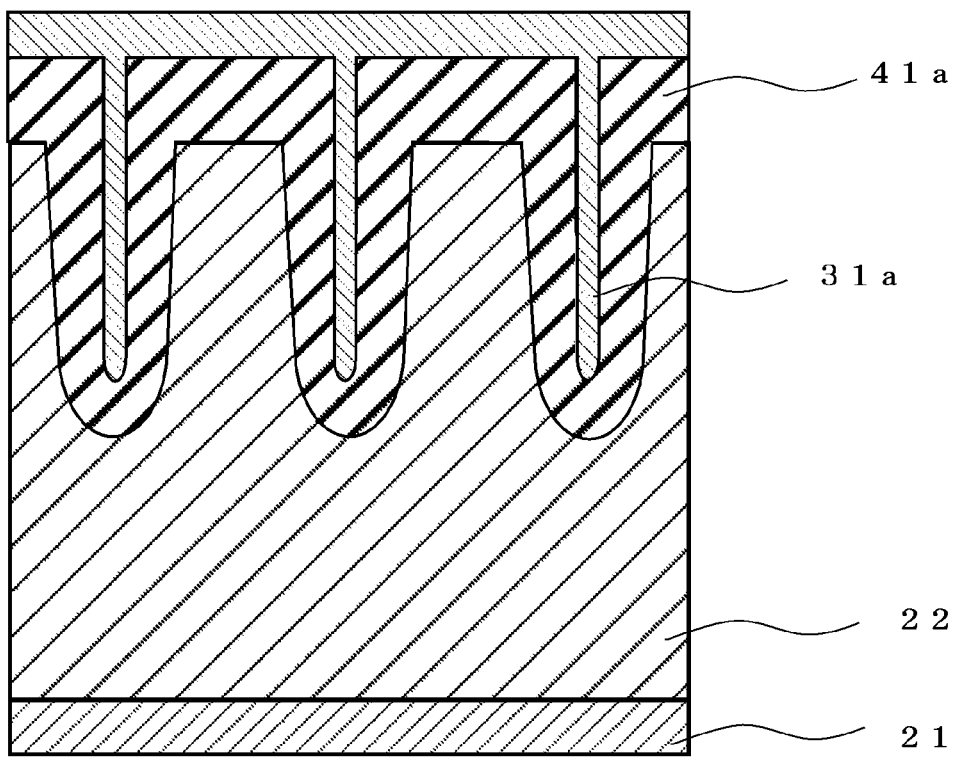
FIG. 4B is a cross-sectional view showing a method of manufacturing the semiconductor device according to the first embodiment.

As shown in FIG. 4B, a conductive layer 31a is formed on the first insulating layer 41a so as to bury the trench T by using the CVD method. The conductive layer 31a is, for example, polysilicon, and contains, for example, phosphorus or boron as conductive impurities.

Figure 5A:
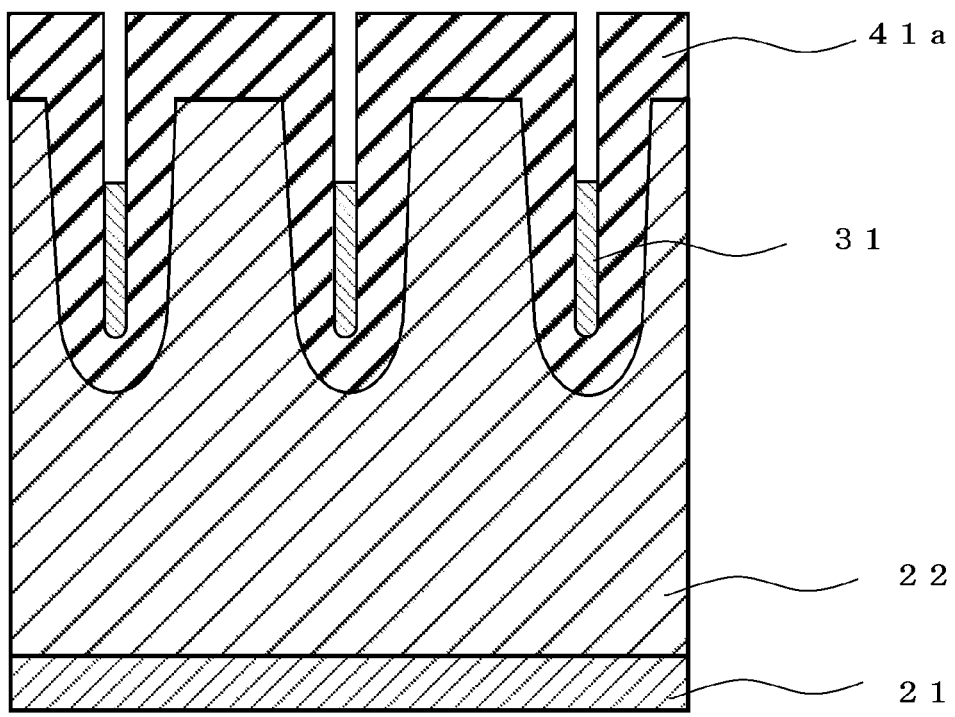
FIG. 5A is a cross-sectional view showing a method of manufacturing the semiconductor device according to the first embodiment.

As shown in FIG. 5A, the conductive layer 31a formed on the first insulating layer 41a is partially removed by reactive ion etching (RIE) to form the first conductive portion 31.

Figure 5B:
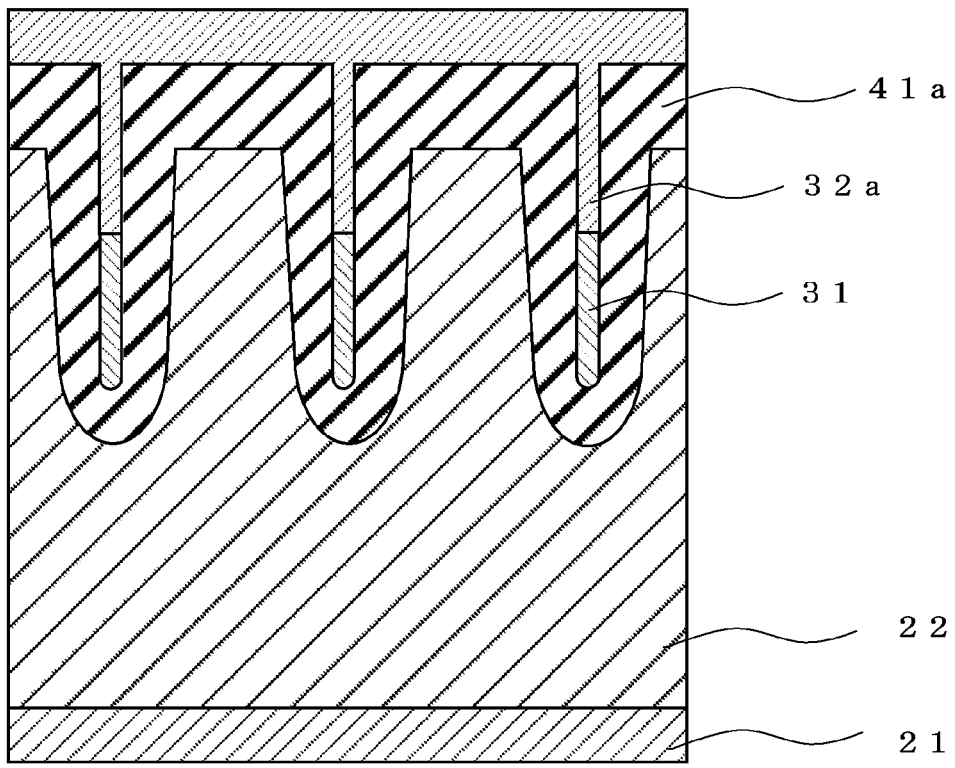
FIG. 5B is a cross-sectional view showing a method of manufacturing the semiconductor device according to the first embodiment.

As shown in FIG. 5B, a conductive layer 32a is formed on the first conductive portion 31 and the first insulating layer 41a by the CVD method. The conductive layer 32a is, for example, polysilicon. The conductive layer 32a may contain conductive impurities (for example, phosphorus). The conductive impurity concentration in the conductive layer 32a is lower than the impurity concentration in the first conductive portion 31.

Figure 6A:
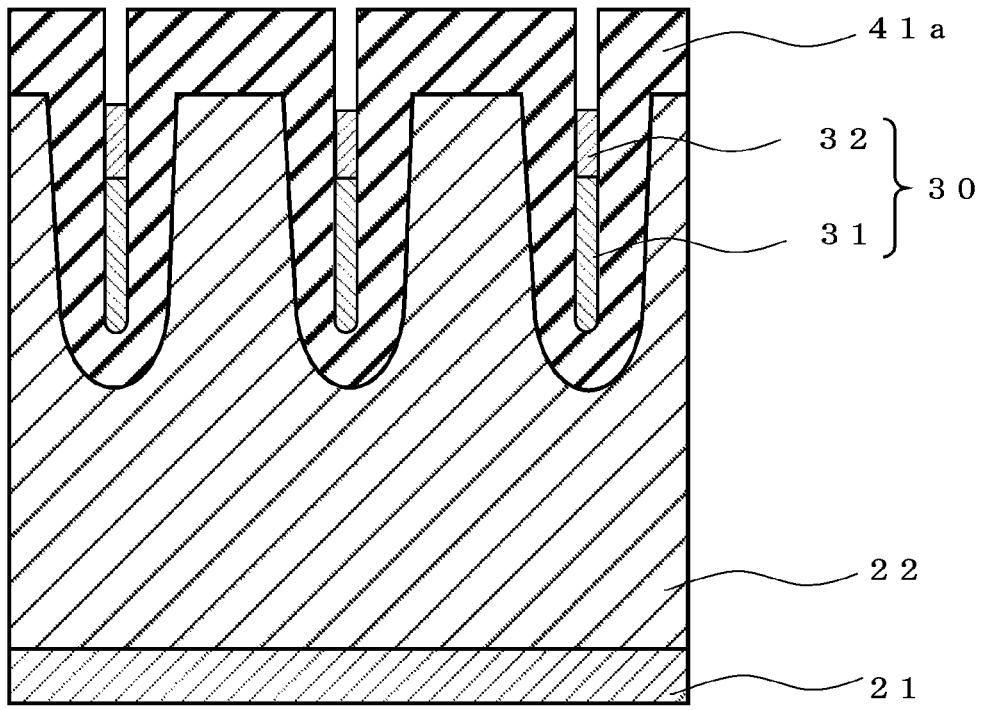
FIG. 6A is a cross-sectional view showing a method of manufacturing the semiconductor device according to the first embodiment.

A part of the upper surface of the conductive layer 32a is removed by chemical dry etching (CDE) or the like. As a result, as shown in FIG. 6A, the second conductive portion 32 is formed, and the conductive portion 30 formed by the first conductive portion 31 and the second conductive portion 32 is provided in each of the plurality of trenches T. In addition, the impurity concentration in the conductive portion 30 is, for example, equal to or more than $1 \times 10^{19}$ cm$^{-3}$ and equal to or less than $1 \times 10^{21}$ cm$^{-3}$.

Figure 6B:
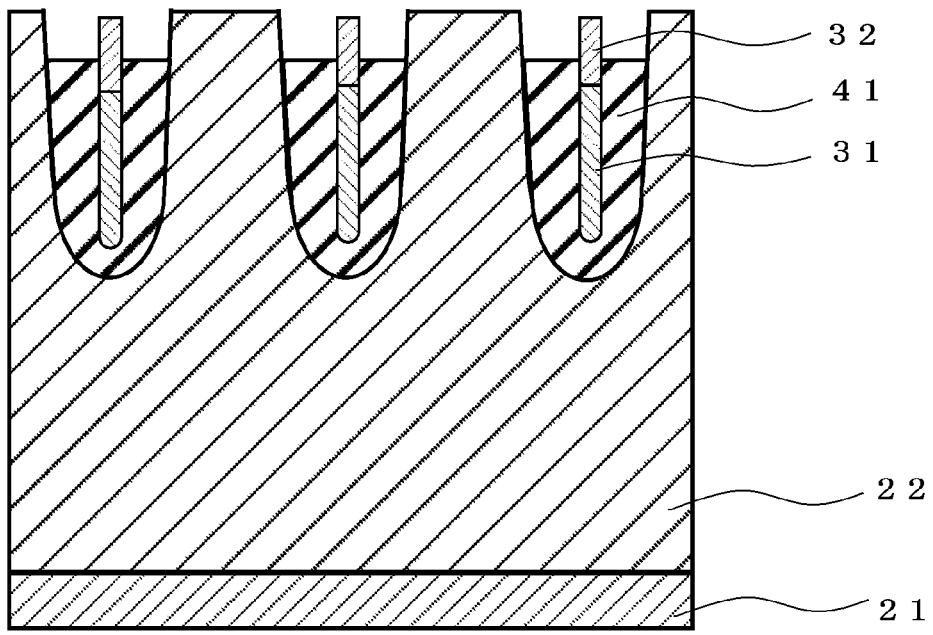
FIG. 6B is a cross-sectional view showing a method of manufacturing the semiconductor device according to the first embodiment.

A part of the first insulating layer 41a is removed by wet etching or CDE, so that the upper surface of the first insulating layer 41a is recessed to form the first insulating portion 41. As a result, as shown in FIG. 6B, the upper portion of the second conductive portion 32 including the upper surface and the side surface is exposed. In addition, the upper surface of the n$^-$-type semiconductor region 22 is exposed. The side surface of the n$^-$-type semiconductor region 22 is exposed to the inner wall of the trench T.

Figure 7A:
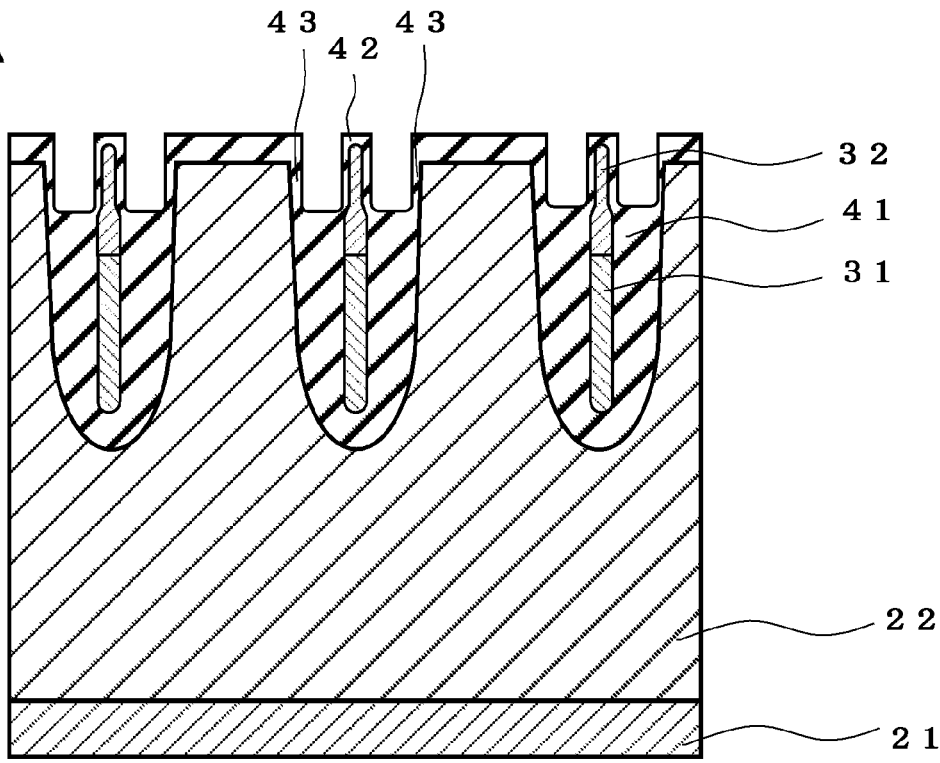
FIG. 7A is a cross-sectional view showing a method of manufacturing the semiconductor device according to the first embodiment.

The upper surface and the side surface of the n$^-$-type semiconductor region 22 and the upper surface and the side surface of the second conductive portion 32 are oxidized by oxidation treatment. As shown in FIG. 7A, the second insulating portion 42 is formed by oxidizing a part of the second conductive portion 32. The second insulating portion 42 may be formed by thermally oxidizing a part of the second conductive portion 32. A part of the second conductive portion 32 that has not been oxidized remains as a conductive layer having a reduced width. The third insulating portion 43 is formed by oxidizing the surface of the n$^-$-type semiconductor region 22. The third insulating portion 43 may be formed by thermally oxidizing the surface of the n$^-$-type semiconductor region 22.

Figure 7B:
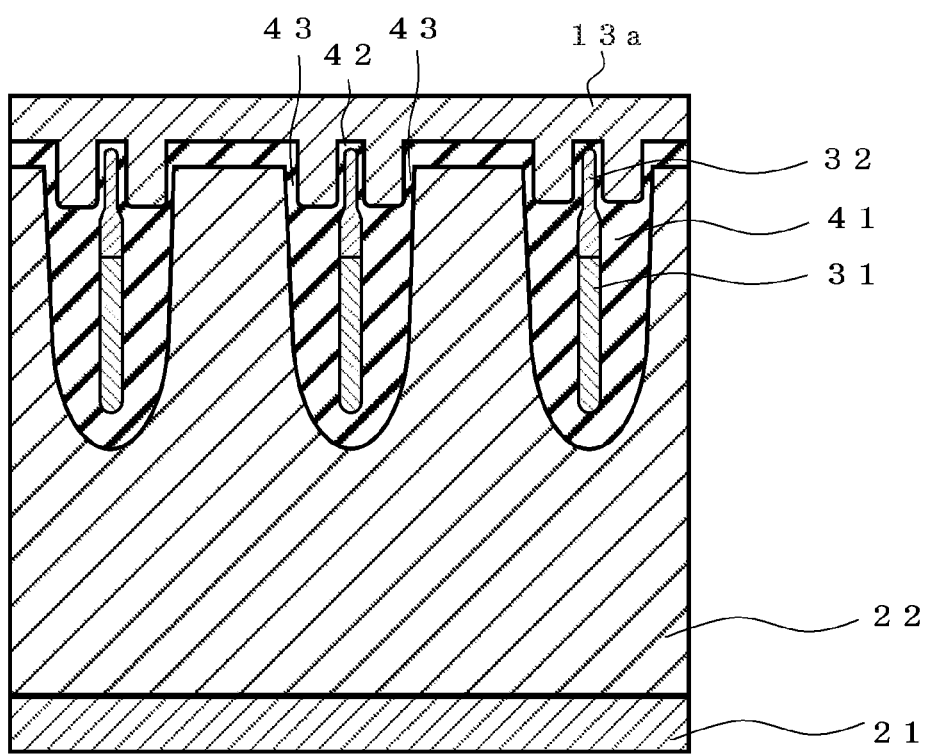
FIG. 7B is a cross-sectional view showing a method of manufacturing the semiconductor device according to the first embodiment.

As shown in FIG. 7B, a conductive layer 13a is formed on the first insulating portion 41, on the n$^-$-type drift region 22, and between the second insulating portion 42 and the third insulating portion 43 by using the CVD. This conductive layer contains polysilicon. The conductive layer 13a may contain conductive impurities (for example, phosphorus).

Figure 8A:
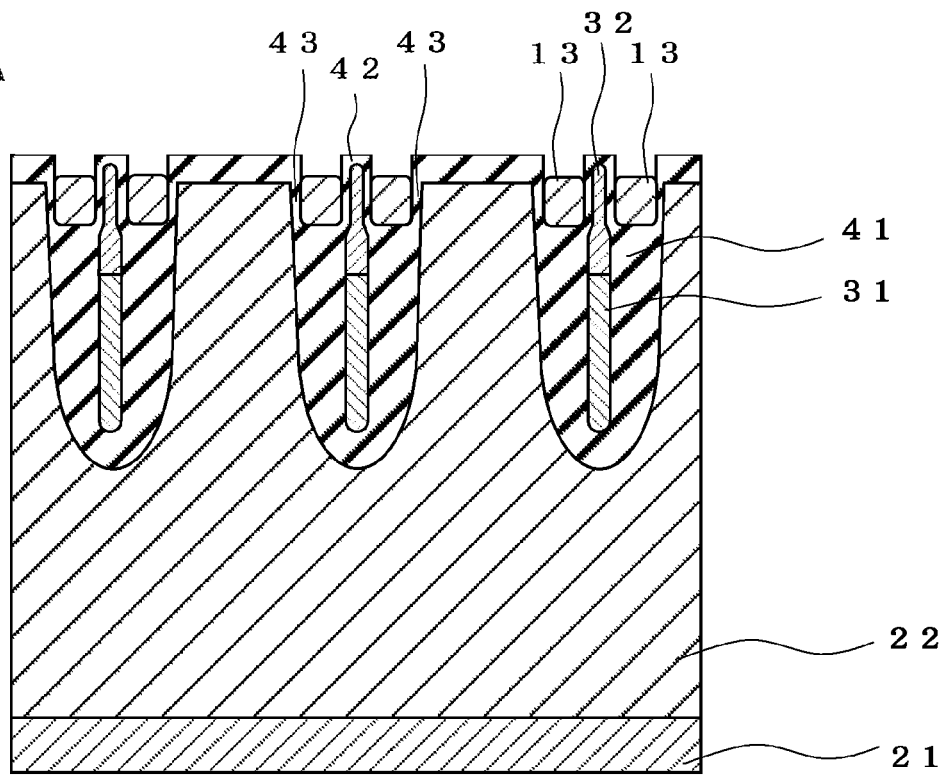
FIG. 8A is a cross-sectional view showing a method of manufacturing the semiconductor device according to the first embodiment.

A part of the conductive layer 13a is removed by CDE or the like to retract the upper surface of the conductive layer 13a. As a result, as shown in FIG. 8A, the gate electrode 13 is formed in the trench T.

Figure 8B:
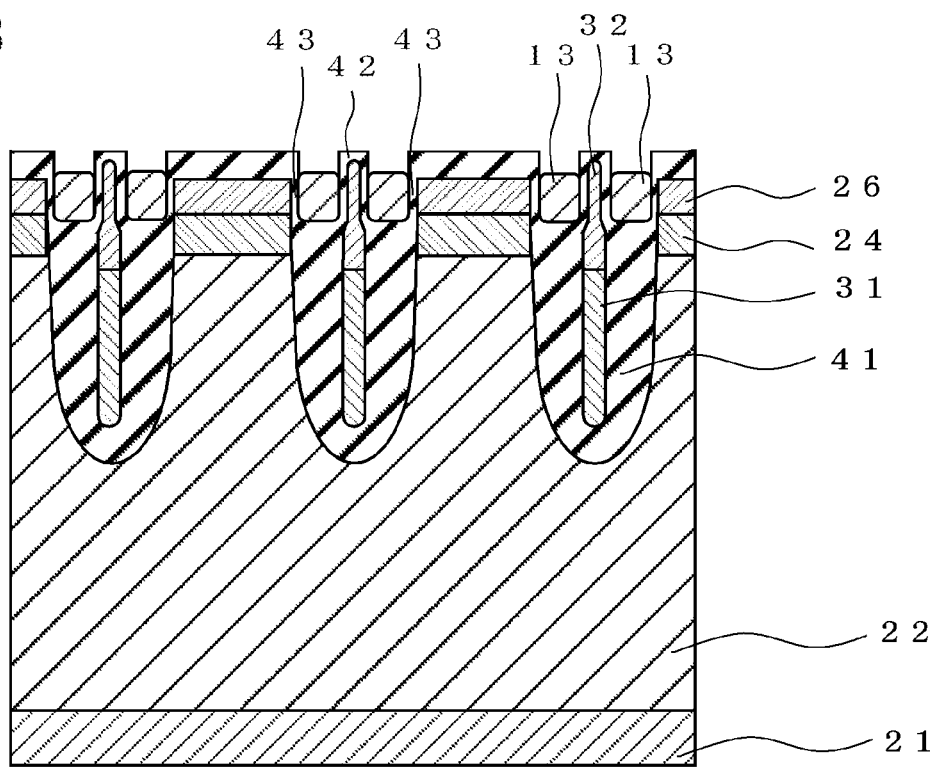
FIG. 8B is a cross-sectional view showing a method of manufacturing the semiconductor device according to the first embodiment.

As shown in FIG. 8B, p-type impurities are ion-implanted into the upper portion of the n$^-$-type semiconductor region 22 to form the p-type base region 24. Then, n-type impurities are ion-implanted to form the n$^+$-type source region 26.

Figure 9A:
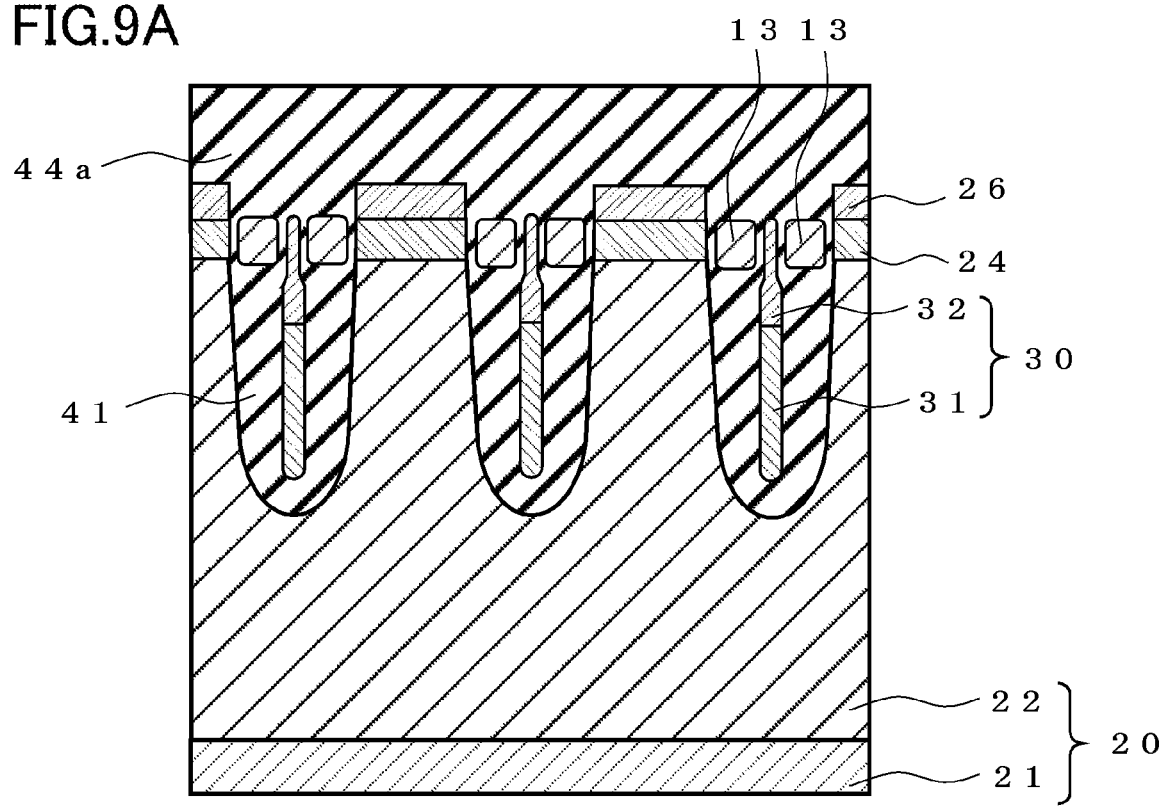
FIG. 9A is a cross-sectional view showing a method of manufacturing the semiconductor device according to the first embodiment.

As shown in FIG. 9A, a fourth insulating layer 44a covering each of the gate electrode 13, the second insulating portion 42, the third insulating portion 43, and the n$^+$-type source region 26 is formed.

Figure 9B:
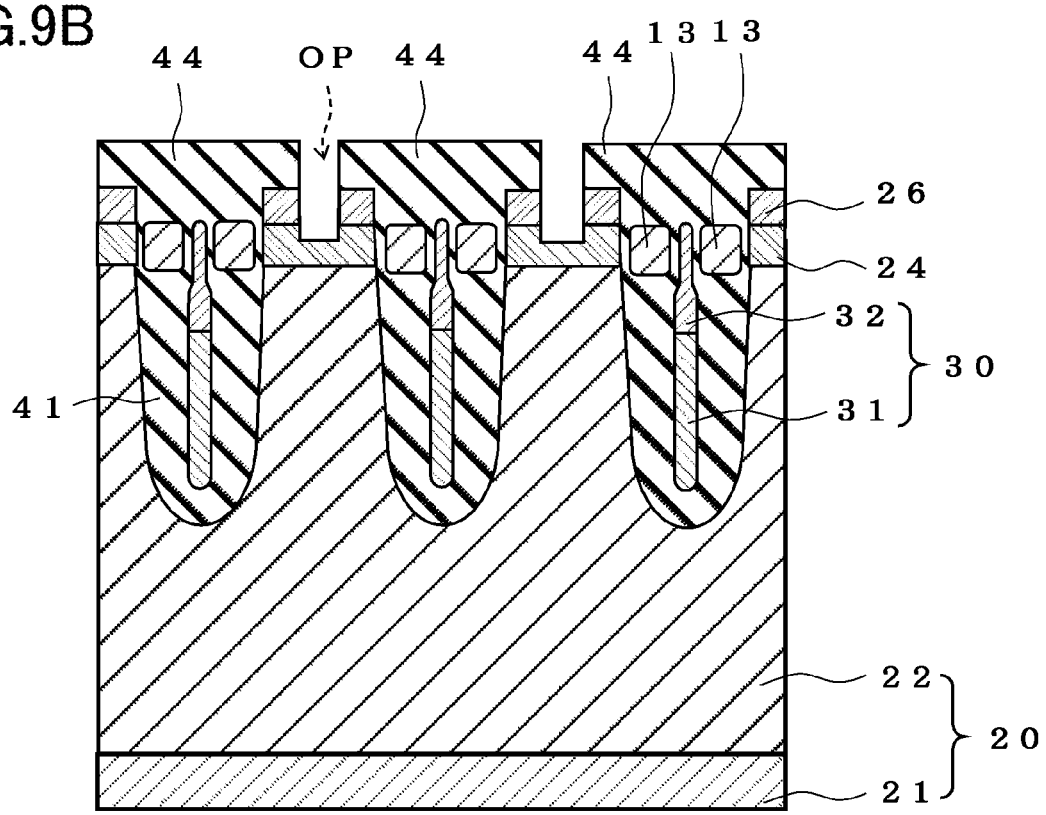
FIG. 9B is a cross-sectional view showing a method of manufacturing the semiconductor device according to the first embodiment.

As shown in FIG. 9B, a part of the n$^+$-type source region 26, a part of the p$^+$-type contact region 25, and a part of the fourth insulating layer 44a on the n$^+$-type source region 26 are removed. Therefore, an opening OP that reaches the p-type base region 24 through the n$^+$-type source region 26 is formed. As a result, a part of the n$^+$-type source region 26 and a part of the p-type base region 24 are exposed.

Figure 10A:
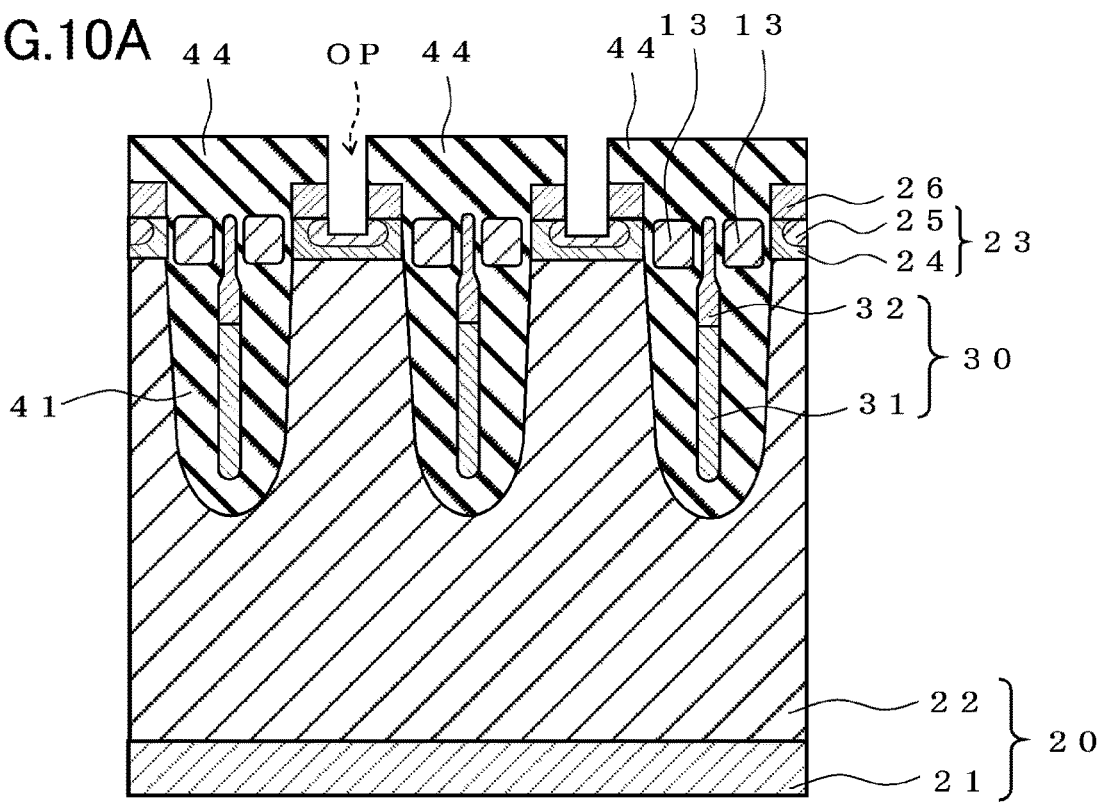
FIG. 10A is a cross-sectional view showing a method of manufacturing the semiconductor device according to the first embodiment.

As shown in FIG. 10A, p-type impurities are ion-implanted into the exposed p-type base region 24 to form the p$^+$-type contact region 25.

Figure 10B:
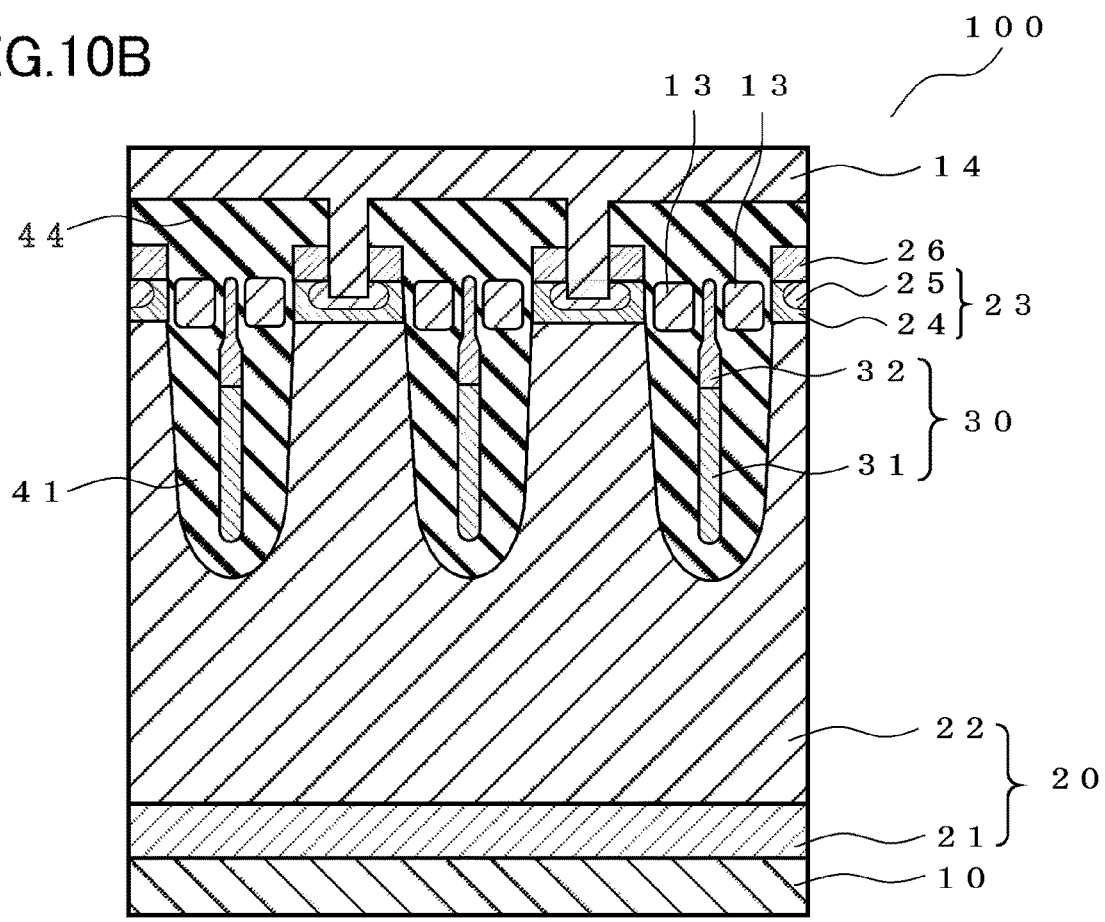
FIG. 10B is a cross-sectional view showing a method of manufacturing the semiconductor device according to the first embodiment.

As shown in FIG. 10B, the source electrode 14 buried in the opening OP is formed on the fourth insulating portion 44. The drain electrode 10 is formed below the n$^+$-type drift region. Through the above steps, the semiconductor device 100 shown in FIGS. 1A, 1B, and 1C is manufactured.

As described above, the second insulating portion 42 is formed by oxidizing the second conductive portion 32 containing impurities such as phosphorus. The concentration of impurities contained in the second conductive portion 32 is equal to or more than $1 \times 10^{19}$ cm$^{-3}$ and equal to or less than $1 \times 10^{21}$ cm$^{-3}$. On the other hand, the first insulating portion 41 and the third insulating portion 43 are formed by oxidizing the n$^-$-type semiconductor region 22. The n-type impurity concentration in the n$^-$-type semiconductor region 22 is equal to or more than $1 \times 10^{15}$ cm$^{-3}$ and equal to or less than $1 \times 10^{16}$ cm$^3$. Therefore, the concentration of impurities contained in the second insulating portion 42 is higher than the concentration of impurities contained in the first insulating portion 41 and the concentration of impurities contained in the third insulating portion 43.

Effect of First Embodiment

The effect of the semiconductor device 100 according to the first embodiment will be described with reference to a semiconductor device 400 according to a comparative example shown in FIG. 11.

The semiconductor device 400 according to a first comparative example is different from the semiconductor device 100 according to the first embodiment in that the conductive portion 30 is formed only by the first conductive portion 31.

Both the semiconductor device 100 according to the first embodiment and the semiconductor device 400 according to the first comparative example have a structure in which a part of the conductive portion 30 is disposed between the gate electrodes 13 in the X direction. For example, in the case of a semiconductor device having a breakdown voltage equal to or more than 100 V, in order to increase the width of the insulating layer 40 in the X direction, it is necessary to increase the width of the trench T in FIG. 3B shown in the above-described manufacturing process. At that time, in the case of a structure in which only one gate electrode 13 is provided in one trench T, that is, in the case of a structure in which a part of the conductive portion 30 is not disposed between the two gate electrodes 13 in the X direction, the width of the gate electrode 13 in the X direction is increased. Accordingly, there is a possibility that the burying formation of the gate electrode 13 will be insufficient. On the other hand, by adopting a structure in which a part of the conductive portion 30 is disposed between the two gate electrodes 13 in the X direction, that is, a structure in which the two gate electrodes 13 are formed in one trench T, the width of one gate electrode 13 is reduced. Therefore, the burying accuracy of the gate electrode 13 can be improved.

In the comparative example, the second insulating portion 42 between the gate electrode 13 and the conductive portion 30 is formed by oxidizing the conductive portion 30, for example. As described above, since the conductive portion 30 is electrically connected to the source electrode 14, the conductive portion 30 contains a high concentration of impurities in order to reduce the connection resistance (wiring resistance) between the conductive portion 30 and the source electrode 14.

However, in polysilicon with a high impurity concentration, the grain size tends to be non-uniform, so that large and small grains are likely to be mixed and formed. If polysilicon with a non-uniform grain size is oxidized, large grains push out relatively small grains, and accordingly, relatively small grains may be captured in the oxide film. In a place where small grains are included, the insulating film (oxide film) is formed thin by the grain size. For this reason, the film thickness of the second insulating portion 42 becomes non-uniform, and accordingly, the breakdown tolerance of the insulating film between the gate electrode 13 and the conductive portion 30 is reduced. As a result, the second insulating portion 42 between the gate electrode 13 and the conductive portion 30 may breaks down while repeating the on/off operation of the semiconductor device 400, which leads to a short circuit between the gate electrode and the source electrode.

As an example of making the film thickness of the second insulating portion 42 uniform to secure the breakdown tolerance of the insulating film, a method of reducing the width of the conductive portion 30 in the X direction can be considered. If the width of the conductive portion 30 in the X direction is reduced, polysilicon grains can grow only up to the trench width when forming the conductive portion 30. Since the generation and growth of polysilicon having a non-uniform grain size are suppressed, it is easy to make the grain size of polysilicon uniform. As a result, small silicon grains are relatively less likely to be formed, which reduces the possibility that small grains will be captured in the oxide film. However, when the conductive portion 30 is formed by CVD, if the thickness of the conductive portion 30 in the X direction is reduced, the burying property of polysilicon deteriorates, which may cause voids. Therefore, it is desirable to secure a certain thickness of the conductive portion 30 in the X direction from the viewpoint of the reliability of the semiconductor device.

Based on the above discussions, the effect of the semiconductor device 100 according to the first embodiment will be described. In the semiconductor device 100, the second insulating portion 42 between the gate electrode 13 and the second conductive portion 32 is formed by oxidizing the second conductive portion 32. Since the impurity concentration in the second conductive portion 32 is lower than the impurity concentration in the first conductive portion 31, non-uniform polysilicon grain size formation is suppressed. Therefore, when a part of the second conductive portion 32 is oxidized, it is possible to suppress the capturing of grains in the second insulating portion 42.

As a result, in the semiconductor device 100 according to the first embodiment, it is possible to suppress the variation in the film thickness of the second insulating portion 42 between the gate electrode 13 and the second conductive portion 32 while maintaining the width of the conductive portion 30 in the X direction. In addition, since the first conductive portion 31 has a high impurity concentration, it is possible to reduce the connection resistance between the conductive portion 30 and the source electrode 14. Therefore, in the semiconductor device 100, since it is possible to maintain the breakdown tolerance of the insulating film between the gate electrode 13 and the conductive portion 30, it is possible to suppress breakdown of the element during operation. In addition, in the semiconductor device 100, since it is possible to reduce the connection resistance between the conductive portion 30 and the source electrode 14, the formation of a depletion layer during the OFF operation is promoted. Therefore, the breakdown voltage can be secured.

Modification Example of First Embodiment

Figure 12A:
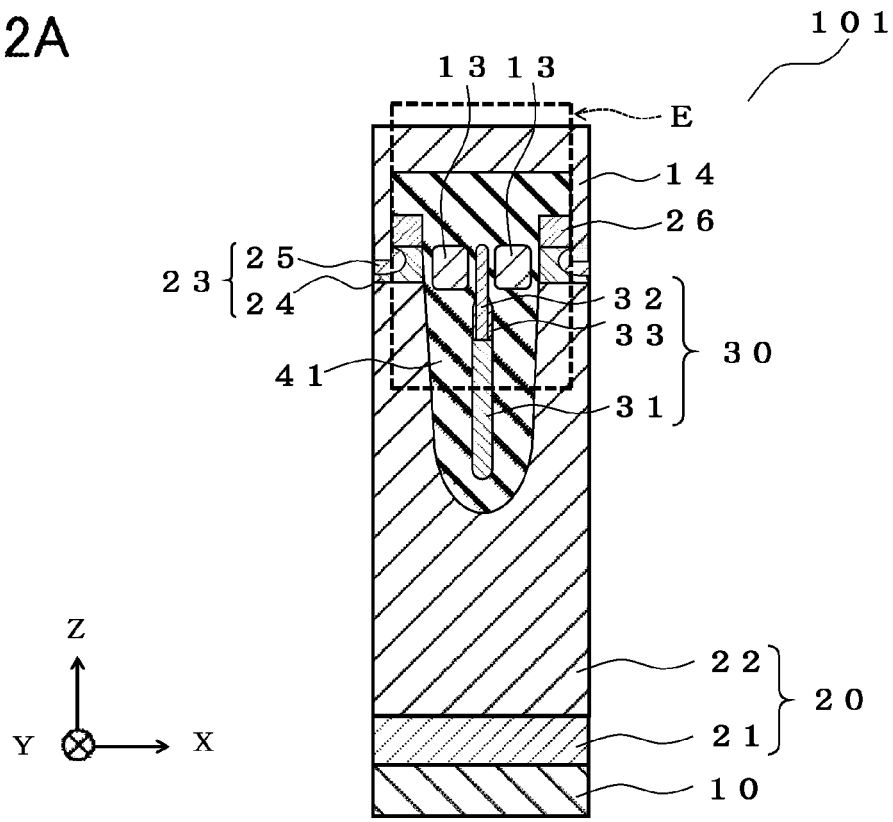
FIG. 12A is a cross-sectional view of a semiconductor device according to a modification example of the first embodiment.
Figure 12B:
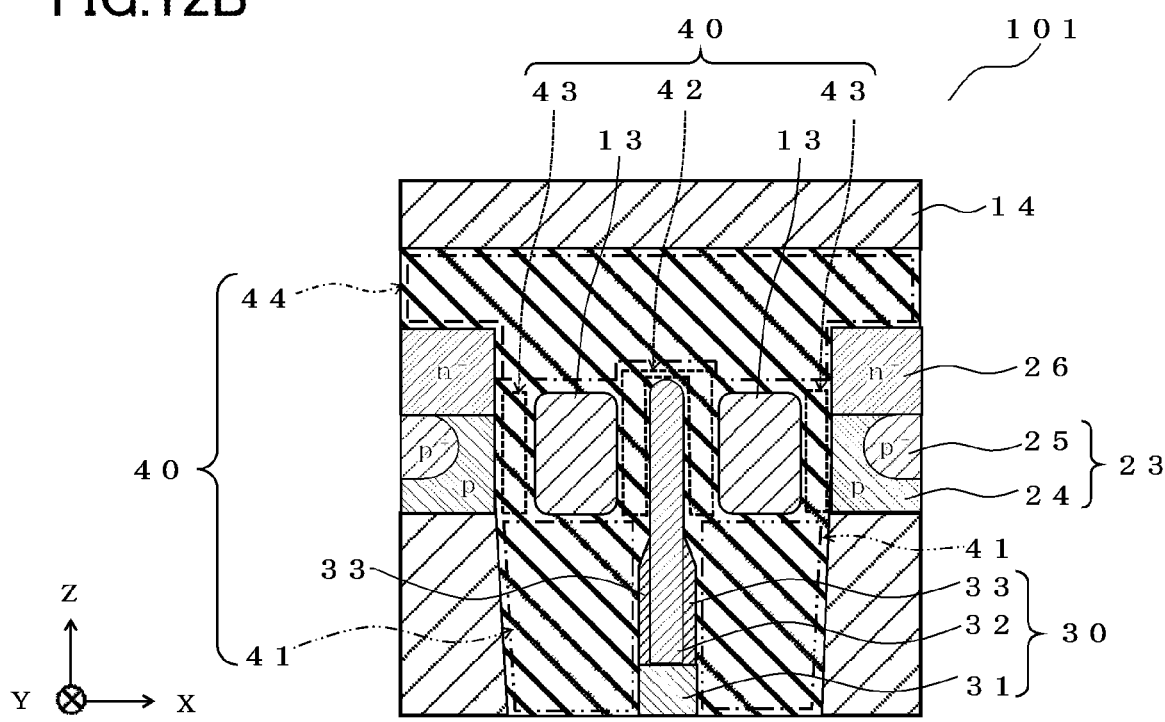
FIG. 12B is a cross-sectional view showing a chain line E portion of FIG. 12A.

A semiconductor device 101 according to a modification example of the first embodiment will be described with reference to FIGS. 12A and 12B. FIG. 12A is a cross-sectional view of the semiconductor device 101 according to the modification example of the first embodiment, and FIG. 12B is a cross-sectional view showing a chain line E portion of FIG. 12A.

The semiconductor device 101 according to the modification example of the first embodiment further include a plurality of third conductive portions 33 compared with the first embodiment. The plurality of third conductive portions 33 are provided around the lower portion of the second conductive portion 32. The plurality of third conductive portions 33 are provided so as to be spaced from each other in the X direction. The third conductive portion 33 is provided between the lower portion of the second conductive portion 32 and the first insulating portion 41 in the X direction. In addition, the third conductive portion 33 is in contact with the first conductive portion 31. In addition, the third conductive portion 33 is in contact with the first insulating portion 41. The sum of the width of the second conductive portion 32 and the width of the third conductive portion 33 in the X direction is larger than the width of the second conductive portion 32 interposed between the two gate electrodes 13 in the X direction. The third conductive portion 33 is formed of, for example, polysilicon. In addition, the third conductive portion 33 can be replaced with an insulating layer such as silicon nitride (SiN). Here, the points overlapping the semiconductor device 100 according to the first embodiment will not be described.

Figure 13A:
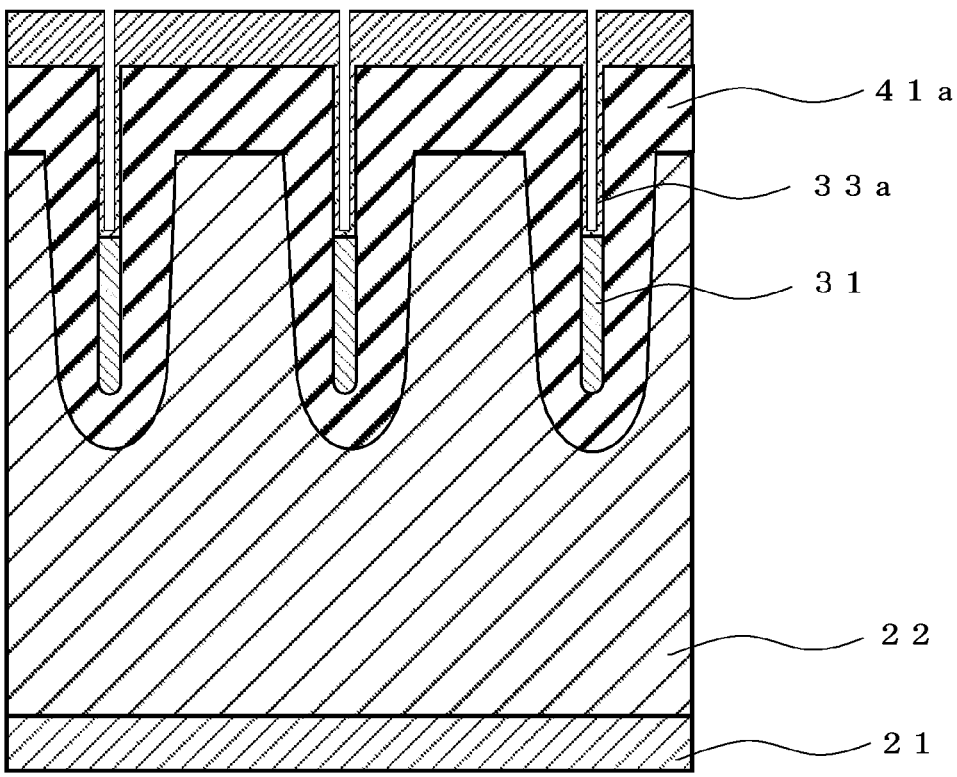
FIG. 13A is a cross-sectional view showing a method of manufacturing the semiconductor device according to the modification example of the first embodiment.

A method of manufacturing the semiconductor device 101 according to the modification example of the first embodiment will be described. After forming the first conductive portion 31 as shown in FIG. 4A in the method of manufacturing the semiconductor device 100 according to the first embodiment, a conductive layer 33a is formed on each of the surface of the first insulating layer 41a and a part of the surface of the conductive portion 31 by using a CVD method as shown in FIG. 13A.

Figure 13B:
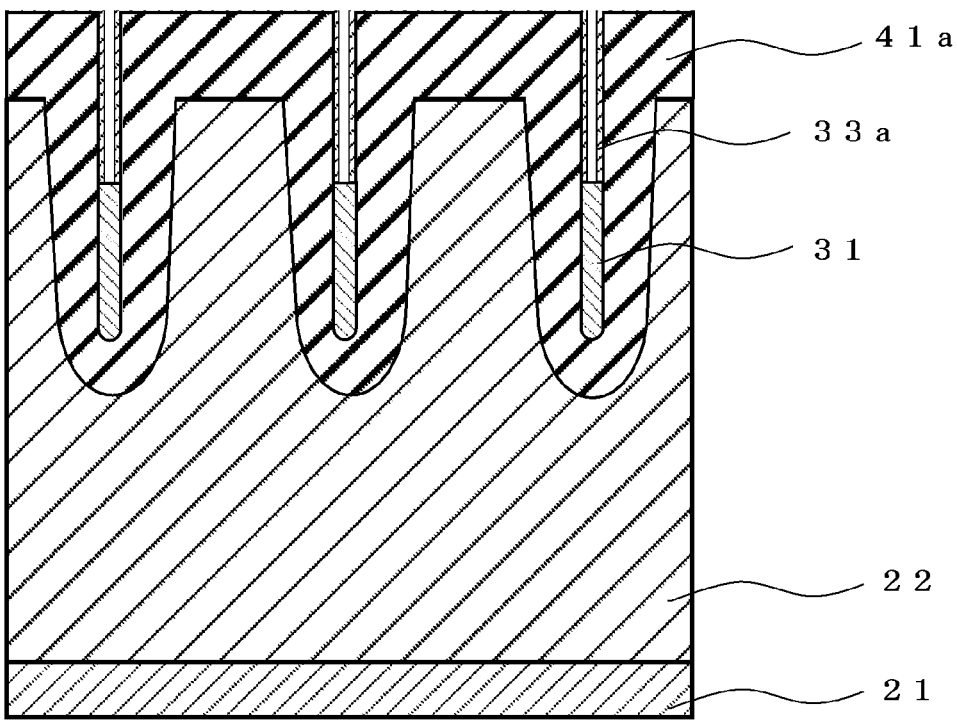
FIG. 13B is a cross-sectional view showing a method of manufacturing the semiconductor device according to the modification example of the first embodiment.

As shown in FIG. 13B, the conductive layer 33a formed on the surface of the first insulating layer 41a outside the trench T and a part of the conductive layer 33a formed on the first conductive portion 31 are removed by wet etching or CDE.

Figure 14A:
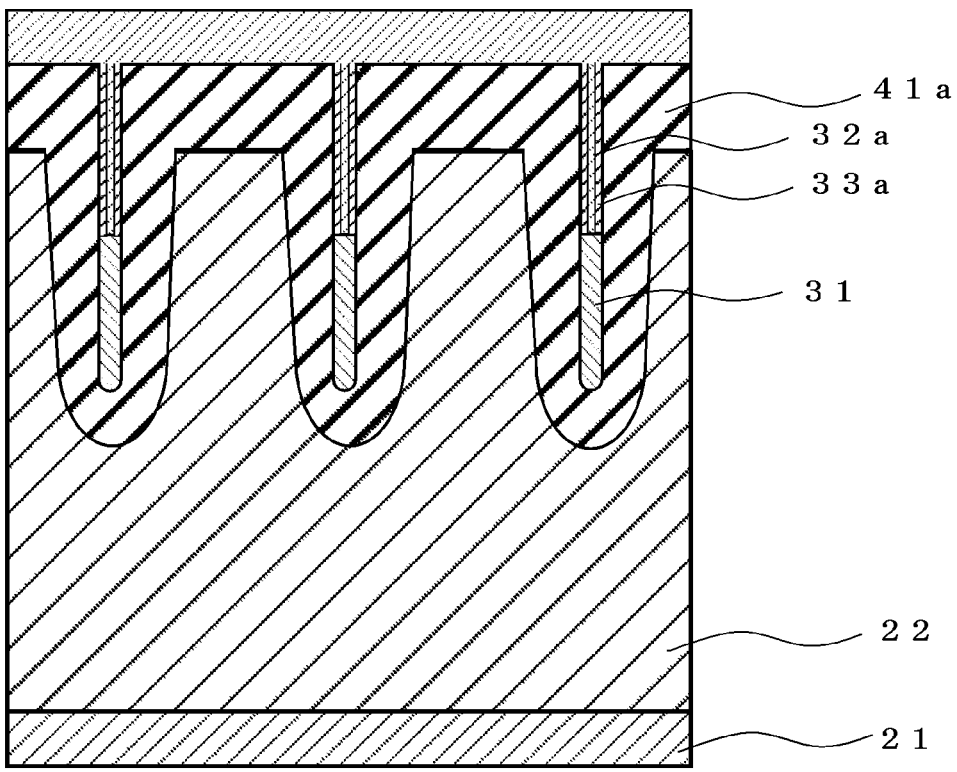
FIG. 14A is a cross-sectional view showing a manufacturing method of the semiconductor device according to the modification example of the first embodiment.

As shown in FIG. 14A, the conductive layer 32a is formed on the first conductive portion 31 and between the left and right conductive layers 33a by using the CVD method. The conductive layer 32a is buried in the trench T.

Figure 14B:
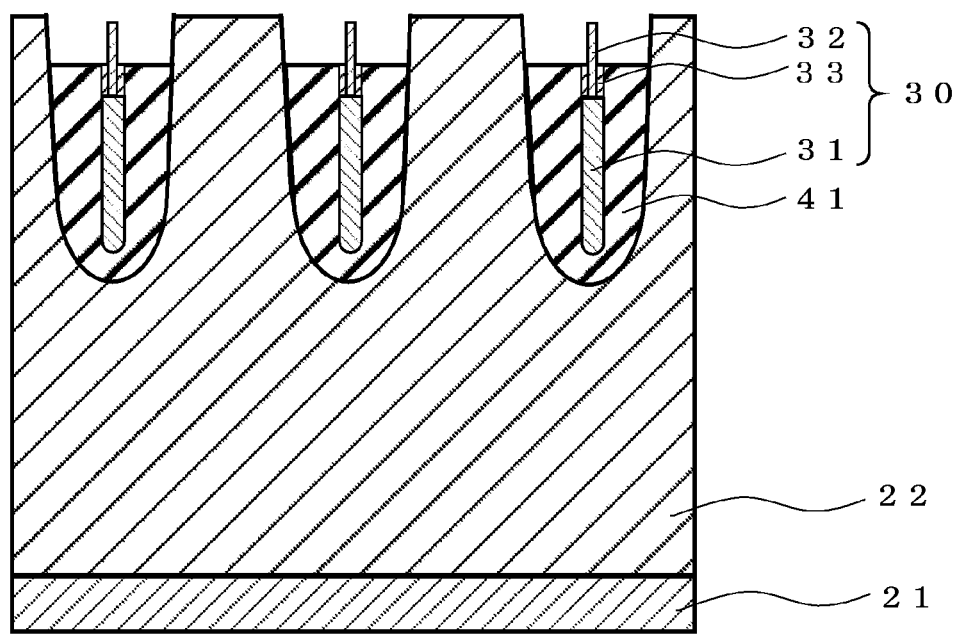
FIG. 14B is a cross-sectional view showing a method of manufacturing the semiconductor device according to the modification example of the first embodiment.

As shown in FIG. 14B, a part of the first insulating layer 41a and a part of the conductive layer 33a are removed by wet etching or CDE. Therefore, the upper surface of the first insulating layer 41a and the upper surface of the conductive layer 33a are recessed. As a result, the second conductive portion 32 and the third conductive portion 33 are formed.

In the method of manufacturing the semiconductor device 101 according to the modification example of the first embodiment, the steps after the step of forming the second insulating portion 42 by oxidizing the second conductive portion 32 as shown in FIG. 7A are the same as in the method of manufacturing the semiconductor device 100 according to the first embodiment.

The structure of the semiconductor device 101 according to the modification example of the first embodiment is the same as the structure of the semiconductor device 100 according to the first embodiment except for the points described above. In addition, the method of manufacturing the semiconductor device 101 is the same as the method of manufacturing the semiconductor device 100 except for the points described above. In addition, the semiconductor device 101 according to the modification example of the first embodiment has the same effect as the semiconductor device 100 according to the first embodiment. Since the width of the semiconductor device 101 in the X direction is further reduced only in the upper portion of the conductive portion 30, it is possible to further suppress the variation in the grain size of the polysilicon of the second conductive portion 32. Therefore, it is possible to further suppress the variation in the film thickness of the second insulating portion 42 formed by oxidizing a part of the second conductive portion 32. As a result, in the semiconductor device 101, since it is possible to improve the breakdown tolerance of the insulating film between the gate electrode 13 and the conductive portion 30, it is possible to suppress breakdown of the element during operation.

In addition, since the width of the first conductive portion 31 in the X direction can be maintained constant, the first conductive portion 31 is easily buried and formed in the manufacturing process. Therefore, it is possible to manufacture the semiconductor device 101 in which the breakdown tolerance of the insulating film between the gate electrode 13 and the conductive portion 30 is secured and the connection resistance between the conductive portion 30 and the source electrode 14 is small.

Second Embodiment

Figure 15A:
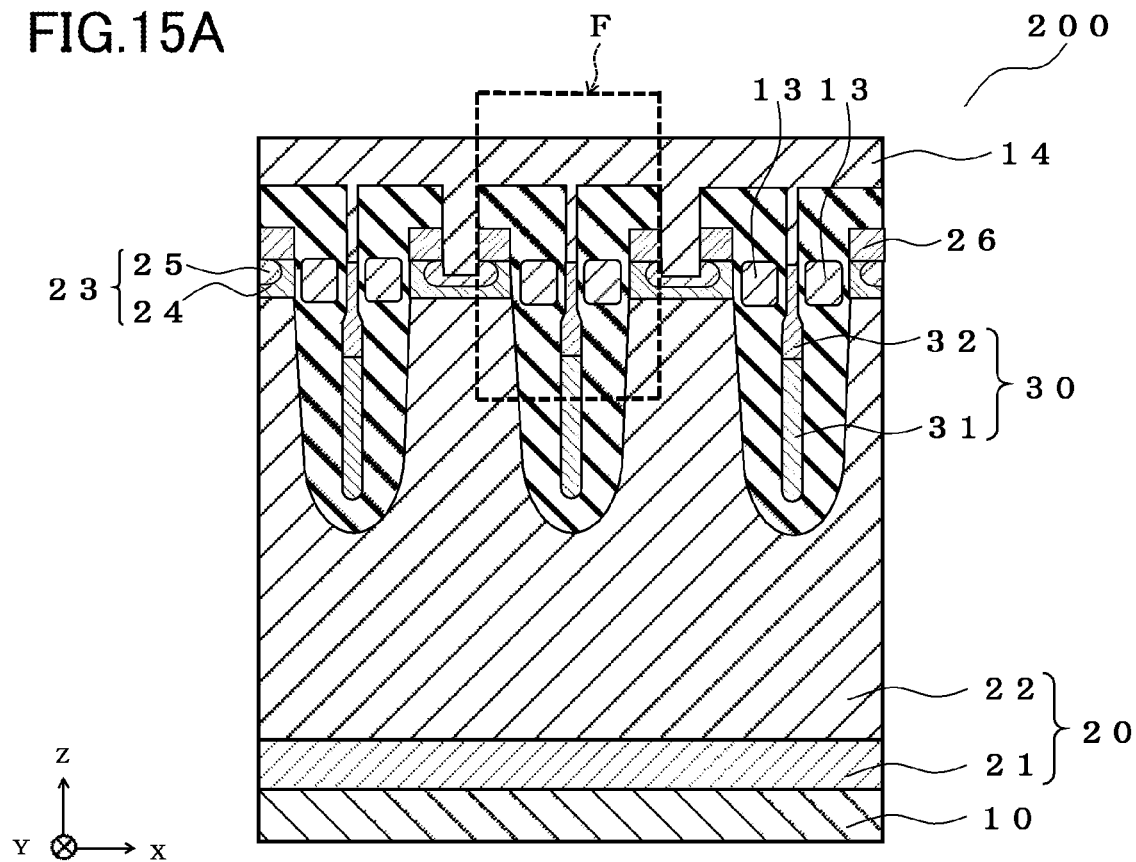
FIG. 15A is a cross-sectional view of a semiconductor device according to a second embodiment.
Figure 15B:
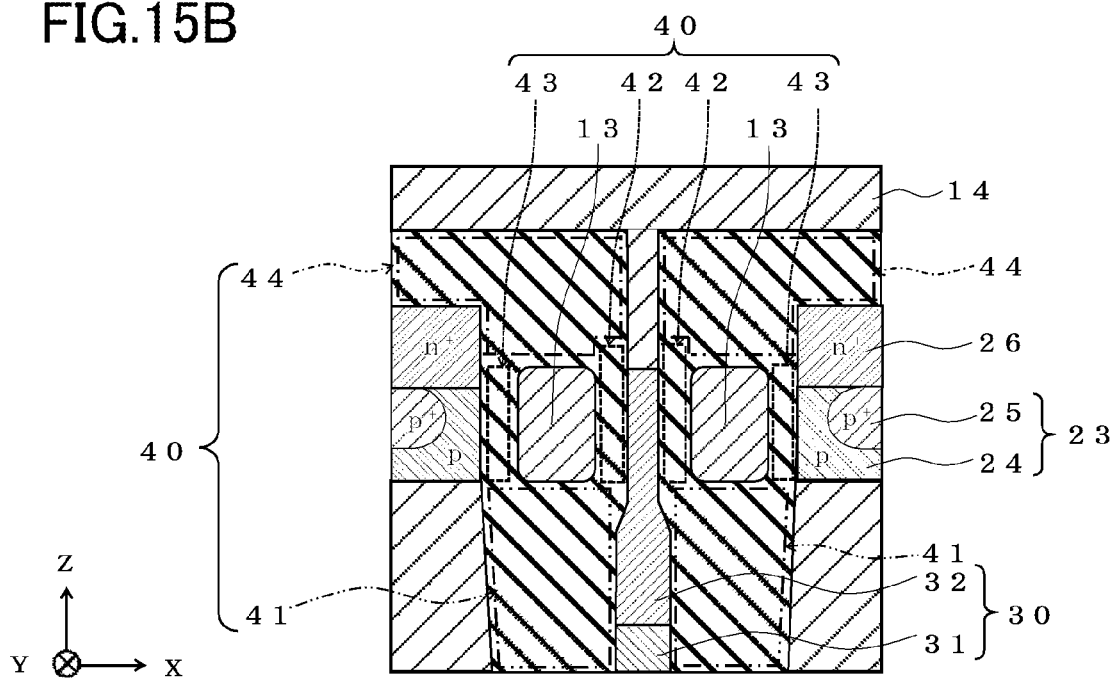
FIG. 15B is a cross-sectional view showing a chain line F portion of FIG. 15A.

A semiconductor device 200 according to a second embodiment will be described with reference to FIGS. 15A and 15B. FIG. 15A is a cross-sectional view of the semiconductor device 200 according to the second embodiment, and FIG. 15B is a cross-sectional view showing a chain line F portion of FIG. 15A.

The semiconductor device 200 according to the second embodiment is different from the semiconductor device 100 according to the first embodiment in that a region immediately above the second conductive portion 32 and the source electrode 14 are directly connected to each other. More specifically, a part of the source electrode 14 connected to the second conductive portion 32 is formed between the $n^+$-type source regions 26 adjacent to each other in the X direction. The points overlapping the semiconductor device 100 according to the first embodiment will not be described. The two gate electrodes 13 are adjacent to each other with the second insulating portion 42 interposed therebetween, for example. In addition, the two gate electrodes 13 are adjacent to each other with the source electrode 14 interposed therebetween, for example. Alternatively, the two gate electrodes 13 are adjacent to each other with the second conductive portion 32 and the source electrode 14 interposed therebetween, for example. In this case, a boundary between the part of the source electrode 14 and the second conductive portion 32 is provided closer to the drain electrode 10 than a boundary between the fourth insulating portion 44 and the gate electrode 13 in the direction from the drain electrode 10 to the first semiconductor region of n-type 20.

A method of manufacturing the semiconductor device 200 according to the second embodiment will be described.

Figure 16A:
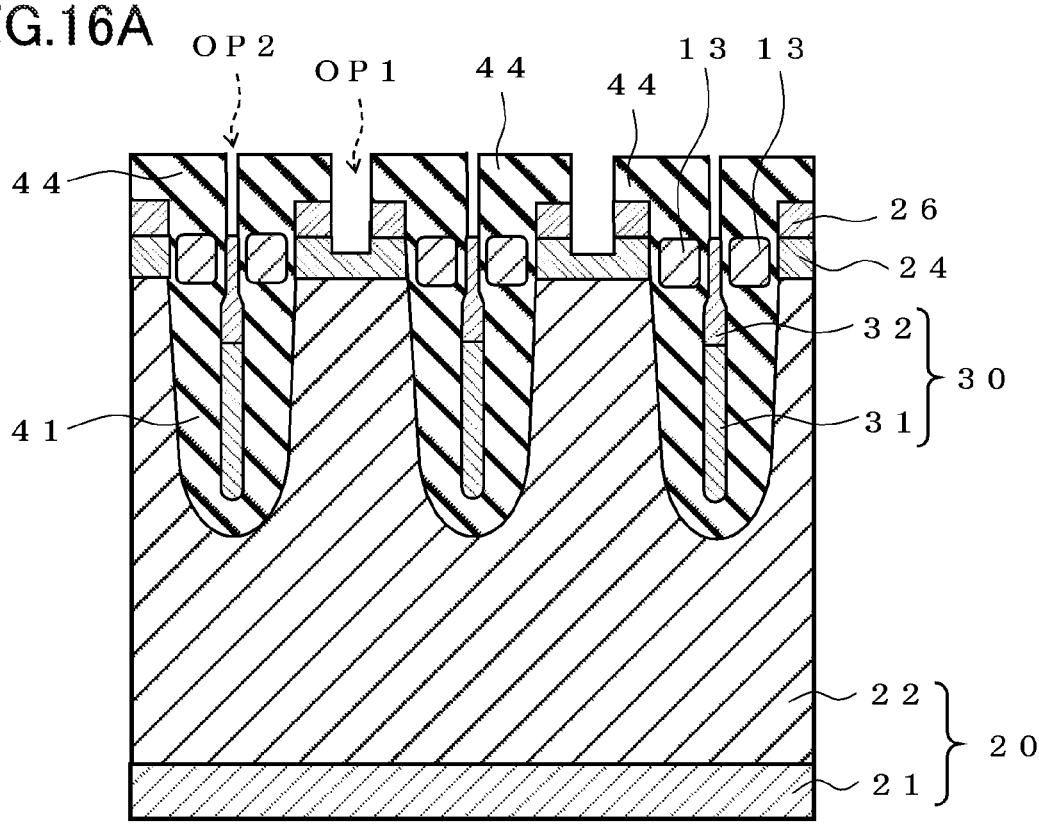
FIG. 16A is a cross-sectional view showing a method of manufacturing the semiconductor device according to the second embodiment.

After forming the fourth insulating portion 44 that covers the gate electrode 13 as shown in FIG. 9A in the method of manufacturing the semiconductor device 100 according to the first embodiment, a part of the fourth insulating layer 44a is removed as shown in FIG. 16A. At this time, in addition to a part of the fourth insulating layer 44a on the $n^+$-type source region 26, a part of the $n^+$-type source region 26, and a part of the $p^+$-type contact region 25, a part of the fourth insulating layer 44a formed on the second conductive portion 32 is removed. As a result, the fourth insulating portion 44 is formed. In addition, a first opening OP1 that reaches the p-type semiconductor region 24 through the $n^+$-type semiconductor region 26 and a second opening OP2 that reaches the second conductive portion 32 through the fourth insulating portion 44 are formed.

Figure 16B:
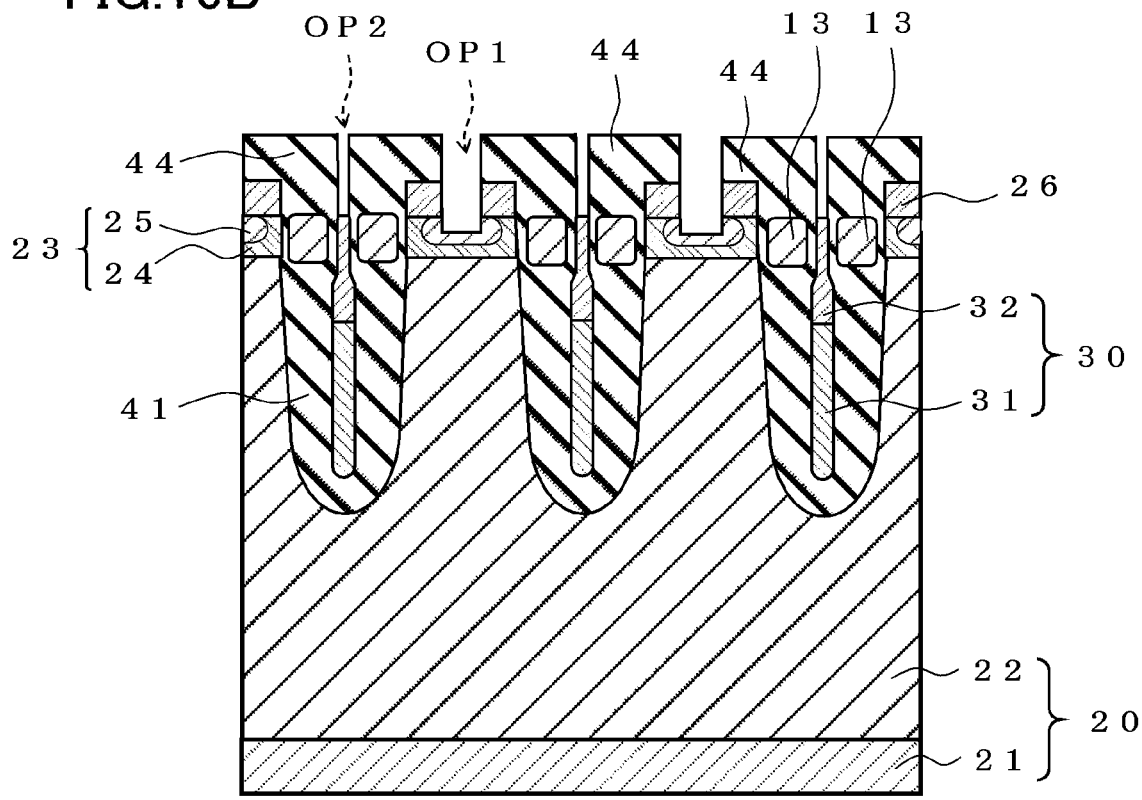
FIG. 16B is a cross-sectional view showing a method of manufacturing the semiconductor device according to the second embodiment.

As shown in FIG. 16B, p-type impurities are ion-implanted into the p-type semiconductor region 24 through the first opening OP1 to form the $p^+$-type semiconductor region 25.

The source electrode 14 is formed on the fourth insulating portion 44 so as to bury the first opening OP1 and the second opening OP2. The drain electrode 10 is formed below the $n^+$-type drain region 21. Through the above steps, the semiconductor device 200 shown in FIGS. 15A and 15B is manufactured.

The structure of the semiconductor device 200 according to the second embodiment is the same as the structure of the semiconductor device 100 according to the first embodiment except for the points described above. In addition, the method of manufacturing the semiconductor device 200 is the same as the method of manufacturing the semiconductor device 100 except for the points described above. In addition, the semiconductor device 200 has the same effect as the semiconductor device 100.

Here, when the MOSFET is turned off, a phenomenon called dynamic avalanche may occur in which holes remaining in the semiconductor layer without being discharged are concentrated and accordingly, the breakdown voltage of the MOSFET is reduced. In addition, the MOSFET in which dynamic avalanche has occurred causes current loss or deterioration of switching efficiency.

On the other hand, for example, there is a structure in which, by providing the field plate electrode in the semiconductor layer as shown in the semiconductor device 400 according to the comparative example, the depletion layer is expanded in the semiconductor layer to maintain the breakdown voltage when the MOSFET is turned off. However, if the voltage abruptly changes when the MOSFET is turned off, a surge current may flow from the drain electrode 10 to the conductive portion 30 through the insulating layer 40. In this case, the voltage applied to the conductive portion 30 rises. Since the voltage applied to the source electrode (field plate electrode) is normally 0 V, the formation of the depletion layer is promoted during the OFF operation of the MOSFET. However, when the voltage applied to the conductive portion 30 rises, the formation of the depletion layer is suppressed. For this reason, the occurrence of the above-described dynamic avalanche becomes more noticeable.

In the case of the semiconductor device 200 according to the second embodiment, since the region immediately above the second conductive portion 32 and the source electrode 14 are directly connected to each other, the resistance of the conductive portion 30 in the Z direction can be reduced. That is, holes that have entered the conductive portion 30 during the OFF operation can be efficiently discharged from the source electrode 14. As a result, it is possible to suppress the occurrence of the dynamic avalanche of the semiconductor device 200 during the OFF operation. Therefore, in the semiconductor device 200, it is possible to increase the breakdown voltage, reduce the current loss, and improve the switching efficiency.

The effect of the semiconductor device 200 according to the second embodiment will be described with reference to the above semiconductor device 400 according to the comparative example.

Figure 11:
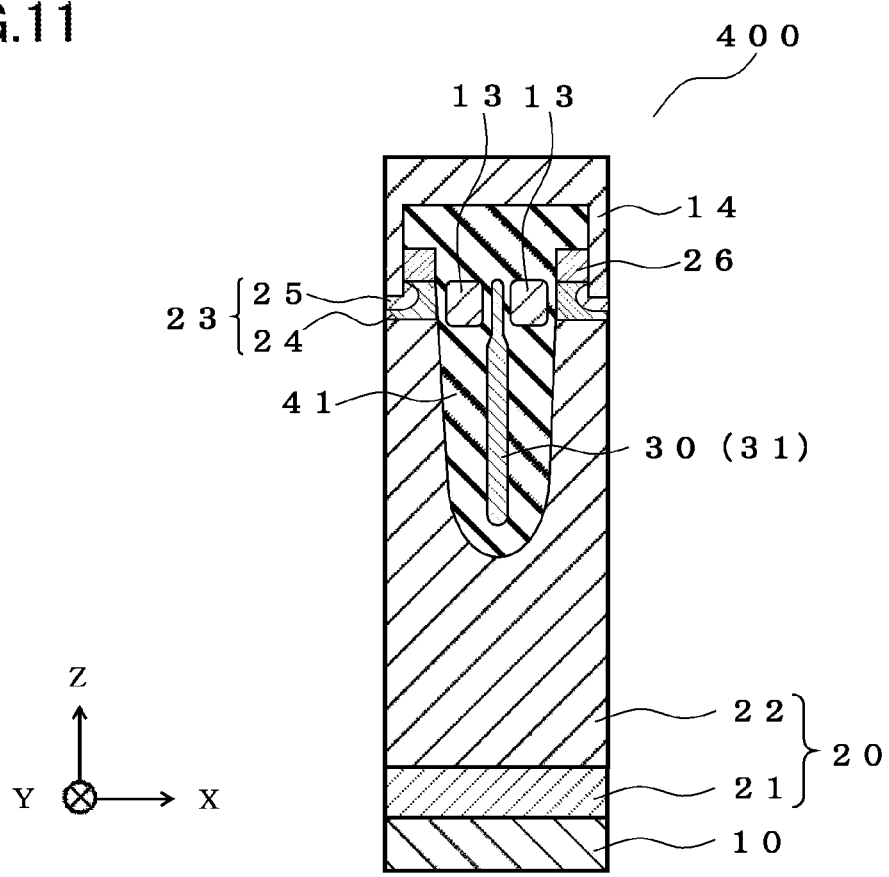
FIG. 11 is a cross-sectional view of a semiconductor device according to a comparative example.
Figure 17A:
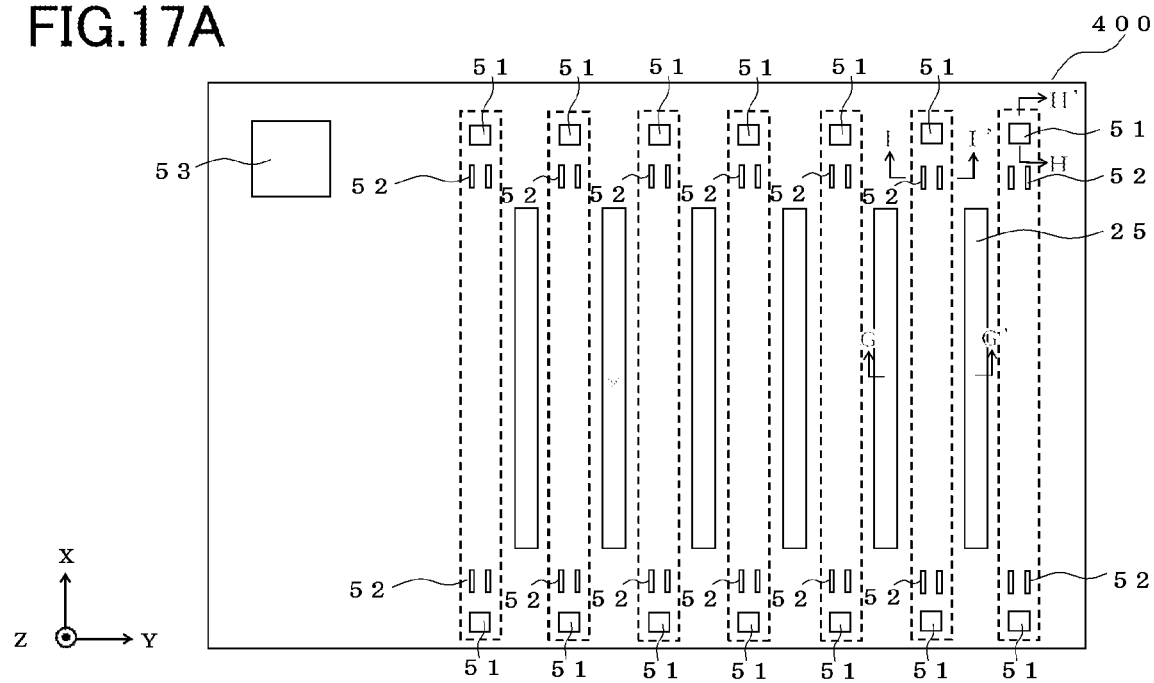
FIG. 17A is a plan view of the semiconductor device according to the comparative example.
Figure 17B:
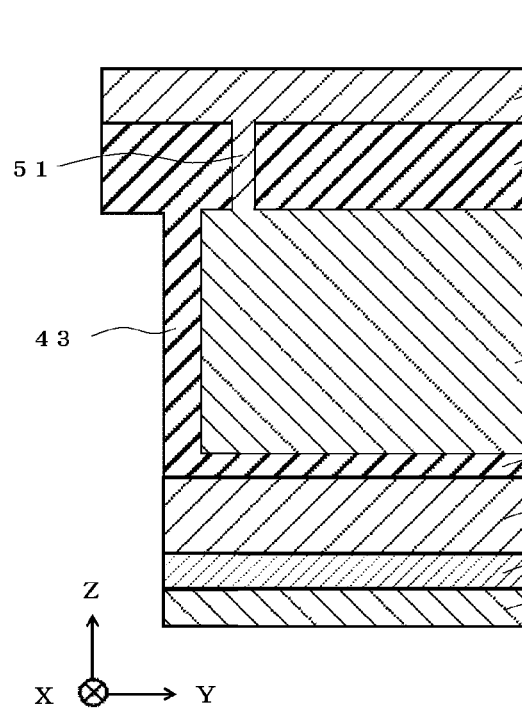
FIG. 17B is a cross-sectional view taken along the line H-H' of FIG. 17A.
Figure 17C:
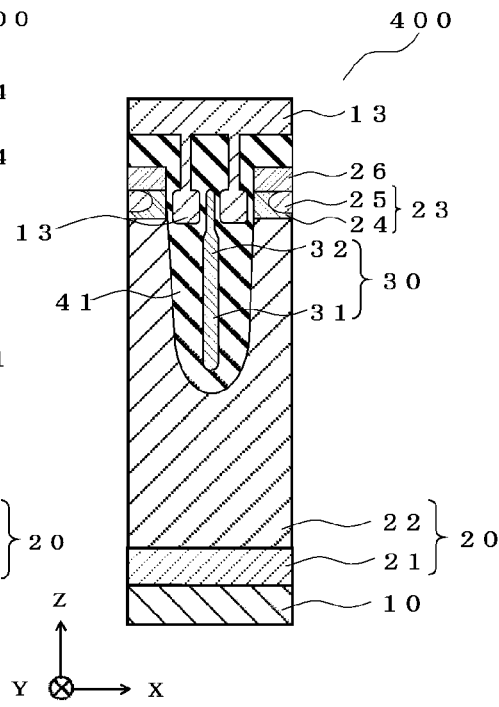
FIG. 17C is a cross-sectional view taken along the line I-I' of FIG. 17A.

FIG. 17A shows a plan view of the semiconductor device 400 according to the comparative example, and the source electrode 14 shown in FIG. 11 is omitted. FIG. 17B shows a cross-sectional view taken along the line H-H' of FIG. 17A, and FIG. 17C shows a cross-sectional view taken along the line I-I' of FIG. 17A. The cross-sectional view taken along the line G-G' of FIG. 17A is a cross-sectional view of the semiconductor device 400 according to the comparative example shown in FIG. 11. In addition, in FIG. 17A, a boundary portion between the p-type base region 24 (or the $n^+$-type source region 26) and the third insulating portion 43 is shown by a chain line.

As shown in FIG. 17B, the semiconductor device 400 according to the comparative example is a semiconductor device in which a field plate electrode 30 is formed in a stripe shape. Therefore, in order to electrically connect the field plate electrode 30 and the source electrode 14 to each other, it is necessary to form the source contact portion 51. The source contact portion 51 is provided in the termination region of the field plate electrode 30.

Figure 18A:
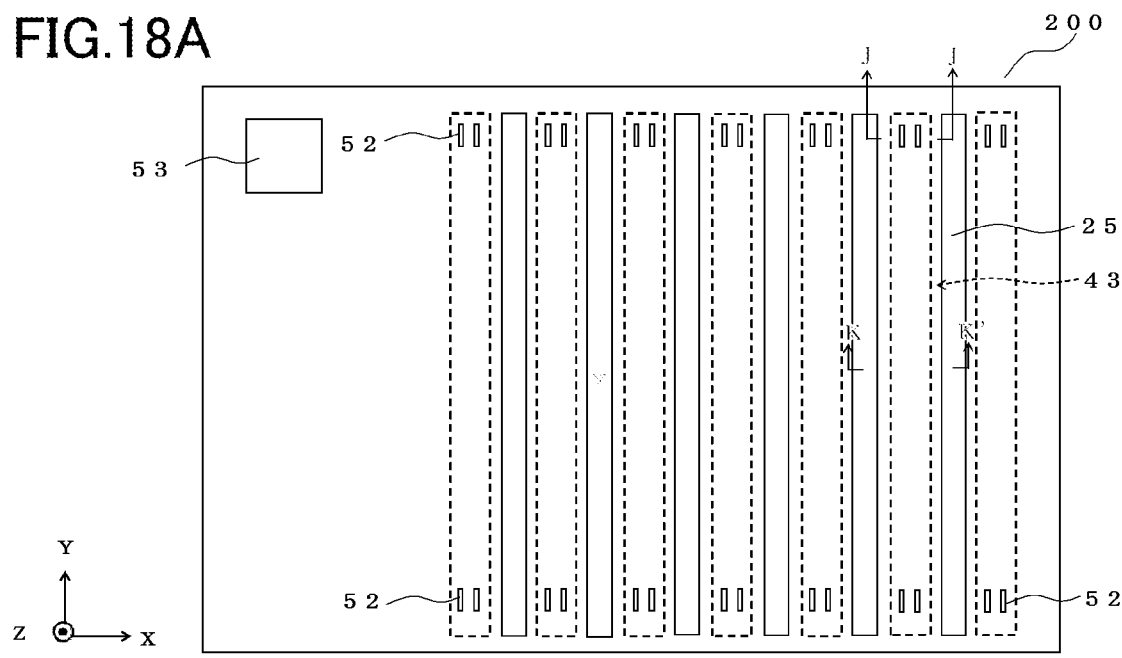
FIG. 18A is a plan view of the semiconductor device according to the second embodiment.
Figure 18B:
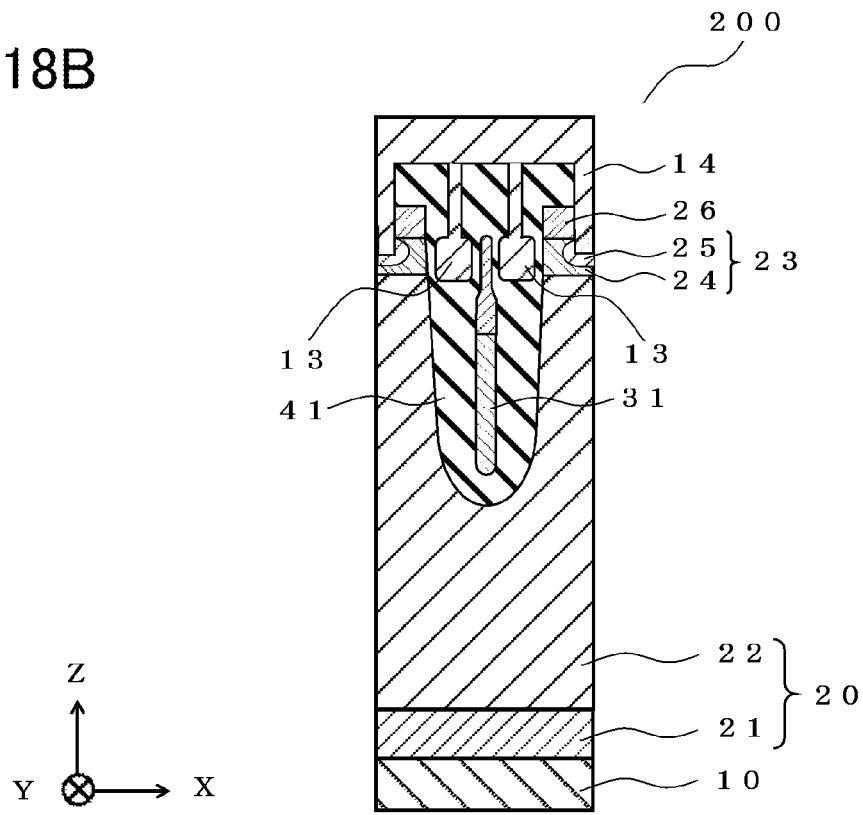
FIG. 18B is a cross-sectional view taken along the line J-J' of FIG. 18A.

FIG. 18A shows a plan view of the semiconductor device 200 according to the second embodiment, and the source electrode 14 shown in FIGS. 15A and 15B is omitted. FIG. 18B shows a cross-sectional view taken along the line J-J' of FIG. 18A. The cross-sectional view taken along the line K-K' of FIG. 18A is a cross-sectional view of the semiconductor device 200 according to the second embodiment shown in FIGS. 15A and 15B.

In the case of the semiconductor device 200 according to the second embodiment, the upper portion of the second conductive portion 32 and the source electrode 14 are directly connected to each other in the Z direction. In the case of the semiconductor device 200 according to the second embodiment, the source electrode 14 and the second conductive portion 32 are connected to each other in the element region. As a result, it is not necessary to provide the source contact portion 51 unlike in the semiconductor device 400 according to the comparative example shown in FIG. 17A. The p-type base region 24, the $n^+$-type source region 26, and the $p^+$-type contact region 25 are not formed in the source contact portion 51. Therefore, the source contact portion 51 becomes an invalid region in which no current flows during the ON operation. In the semiconductor device 200 according to the second embodiment, since it is not necessary to provide the source contact portion 51, the effective area through which a current flows during the ON operation can be increased. Therefore, in the semiconductor device 200 according to the second embodiment, it is possible to reduce the on-resistance.

Modification Example of Second Embodiment

Figure 19:
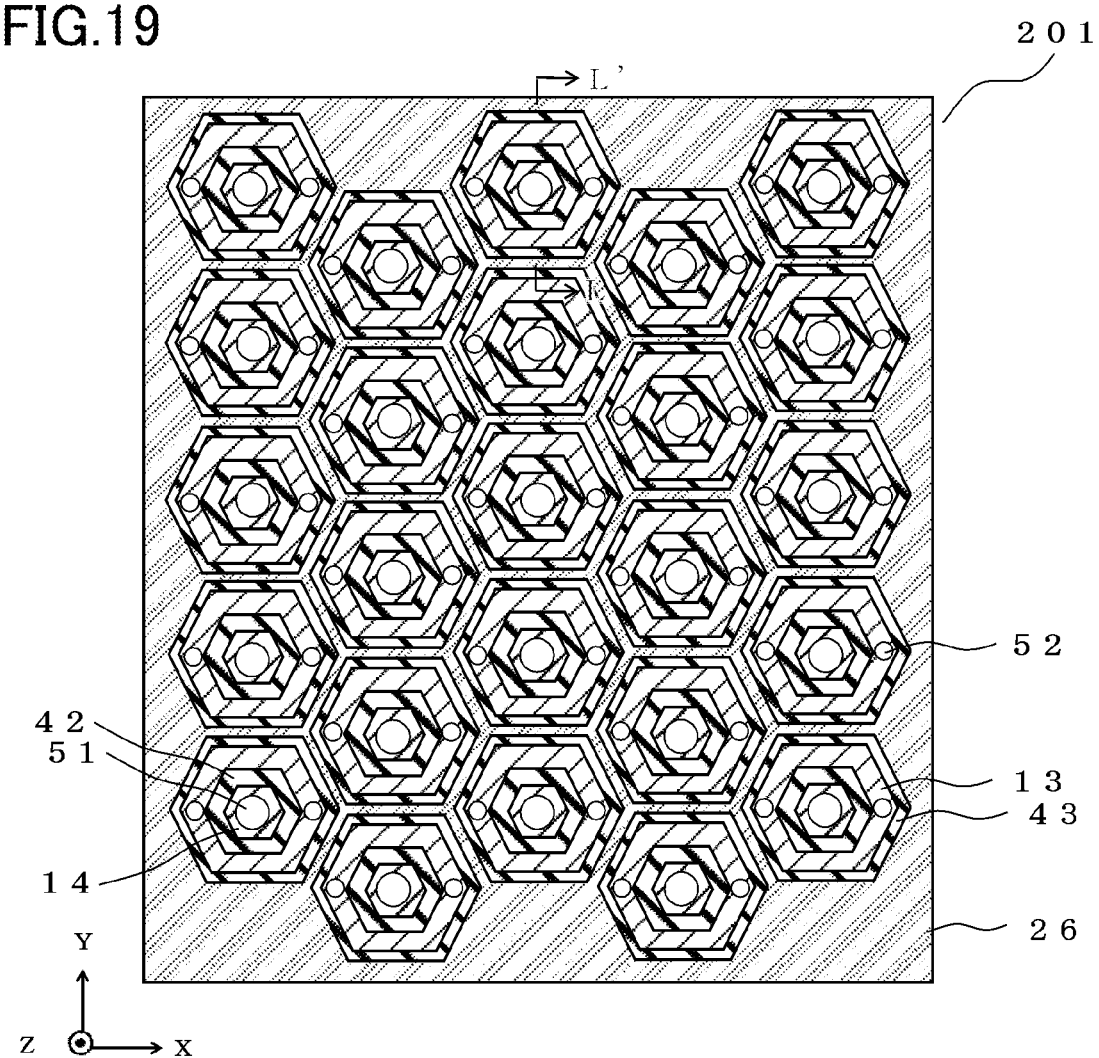
FIG. 19 is a plan view of a semiconductor device having a dot trench type field plate structure.

A semiconductor device 201 according to a modification example of the second embodiment will be described with reference to FIG. 19. FIG. 19 shows a plan view of the semiconductor device 201 having a dot trench type field plate structure. In FIG. 19, the source electrode 14 shown in FIGS. 15A and 15B is omitted. In addition, the cross-sectional view taken along the line L-L' of FIG. 19 is the same as the cross-sectional view of the semiconductor device 200 according to the second embodiment shown in FIGS. 15A and 15B.

The semiconductor device 201 according to the modification example of the second embodiment has a dot trench type field plate structure. Similarly to the semiconductor device 200, in the semiconductor device 201, the upper portion of the second conductive portion 32 and the source electrode 14 are directly connected to each other in the Z direction. Therefore, the semiconductor device 201 can have a dot trench type field plate structure as in this modification example.

Similarly to the semiconductor device 200 according to the second embodiment, in the semiconductor device 201 according to the modification example of the second embodiment, it is possible to increase the effective area through which a current flows during the ON operation.

Third Embodiment

Figure 20A:
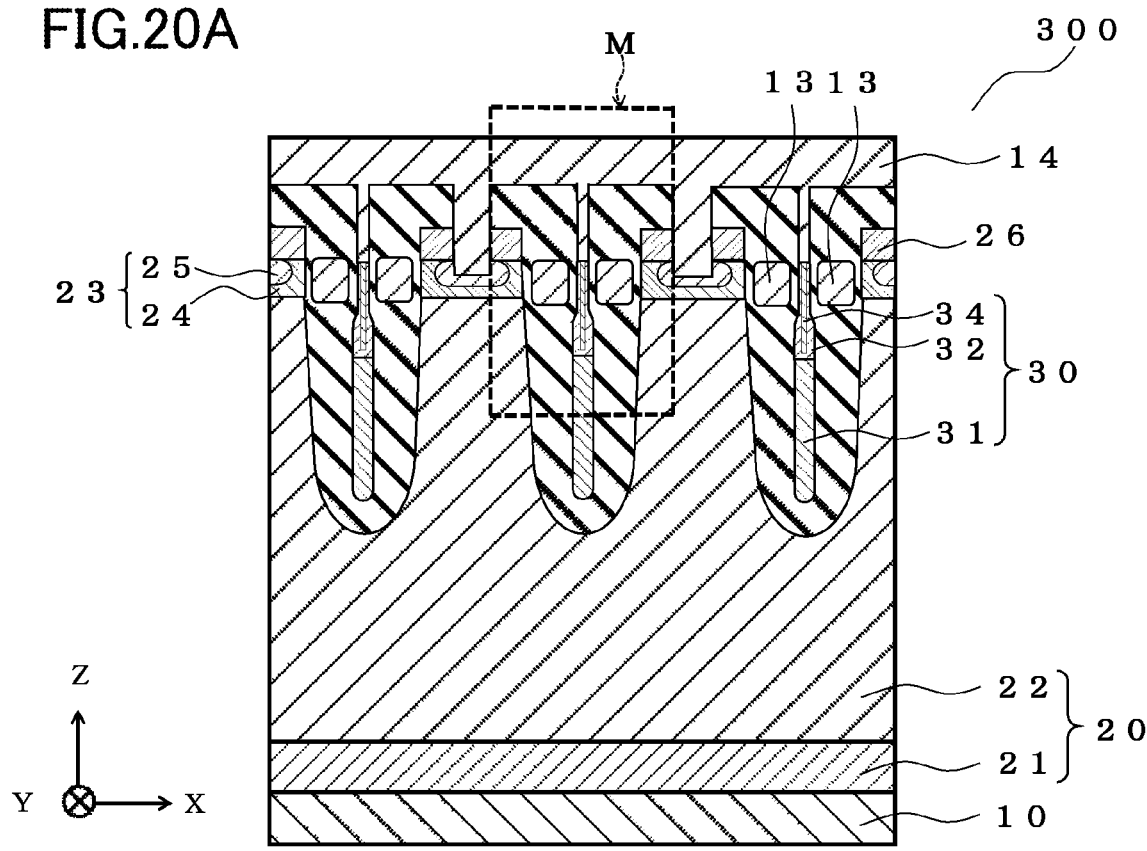
FIG. 20A is a cross-sectional view of a semiconductor device according to a third embodiment.
Figure 20B:
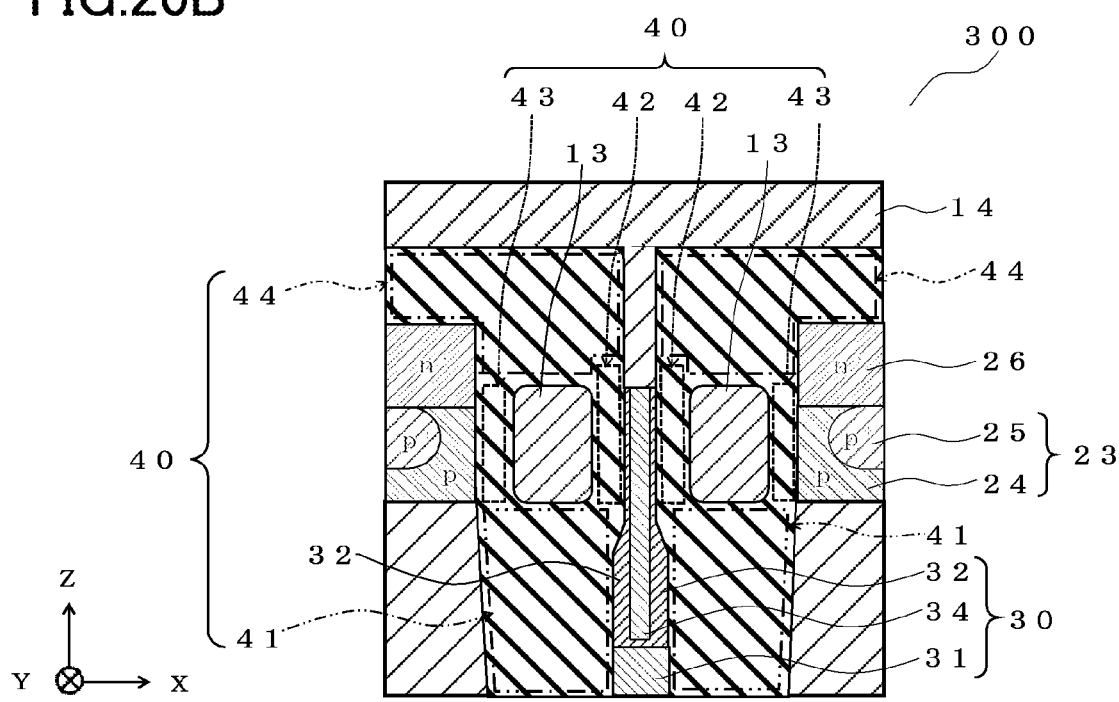
FIG. 20B is a cross-sectional view showing a chain line M portion of FIG. 20A.

A semiconductor device 300 according to a third embodiment will be described with reference to FIGS. 20A and 20B. FIG. 20A is a cross-sectional view of the semiconductor device 300 according to the third embodiment, and FIG. 20B is a cross-sectional view showing a chain line M portion of FIG. 20A.

The semiconductor device 300 according to the third embodiment further includes a fourth conductive portion 34 compared with the second embodiment. The fourth conductive portion 34 is provided so as to extend in the Z direction from above the first conductive portion 31. In addition, the second conductive portion 32 is provided between the fourth conductive portion 34 and the first insulating portion 41 in the X direction. In addition, the second conductive portion 32 is provided between the fourth conductive portion 34 and the gate electrode 13 in the X direction. In addition, the second conductive portion 32 is provided between the fourth conductive portion 34 and the second insulating portion 42 in the X direction. The second conductive portion 32 is formed of polysilicon or silicon nitride (SiN). The impurity concentration in the second conductive portion 32 is lower than the impurity concentration in the fourth conductive portion 34.

In addition, similarly to the semiconductor device 200, a region immediately above the second conductive portion 32 and the source electrode 14 in the semiconductor device 300 are directly connected to each other. Here, the points overlapping the semiconductor device 100 according to the second embodiment will not be described.

A method of manufacturing the semiconductor device 300 according to the third embodiment will be described.

Figure 21A:
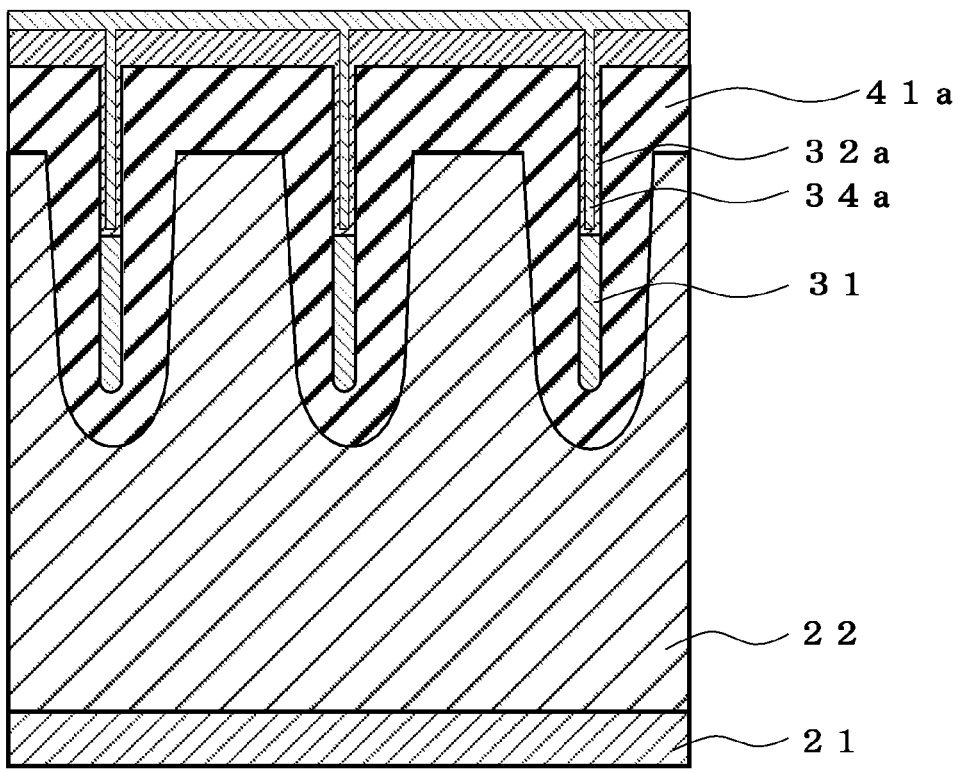
FIG. 21A is a cross-sectional view showing a method of manufacturing the semiconductor device according to the third embodiment.
Figure 21B:
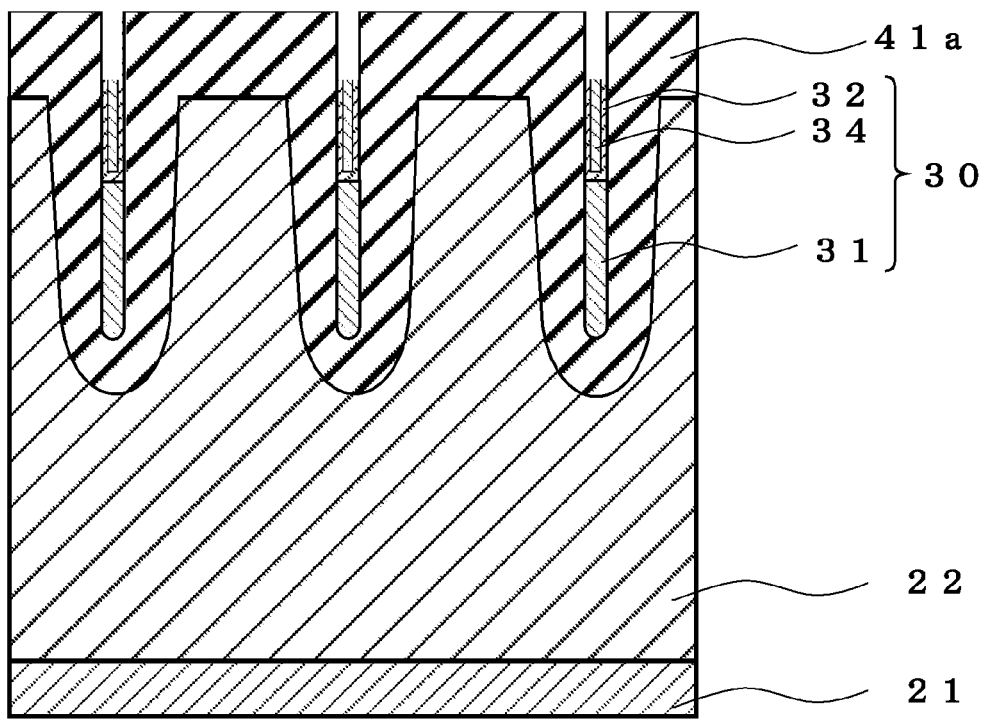
FIG. 21B is a cross-sectional view showing a method of manufacturing the semiconductor device according to the third embodiment.
Figure 22A:
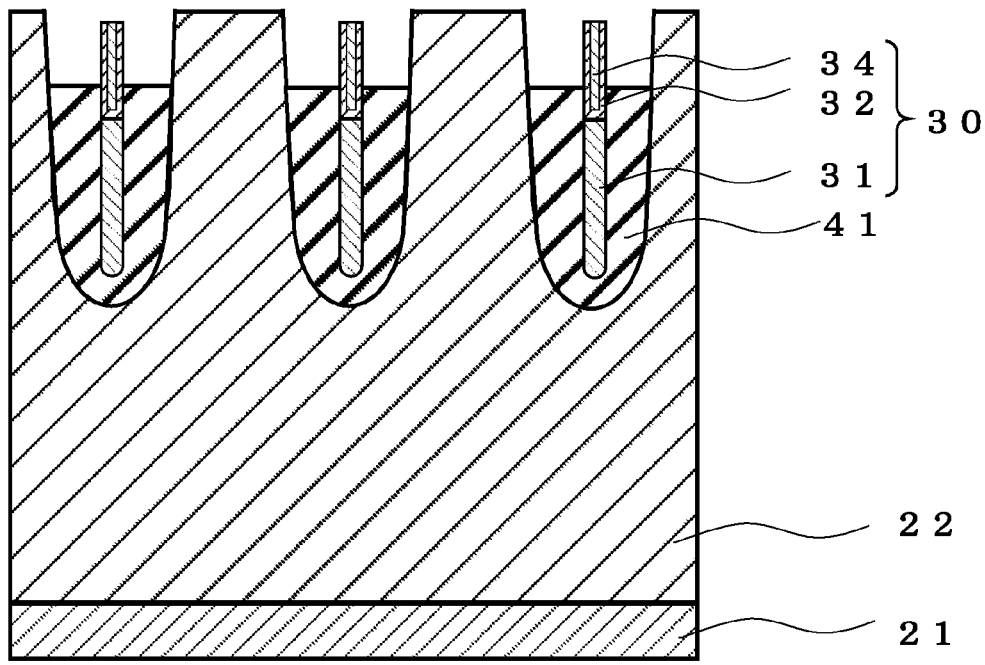
FIG. 22A is a cross-sectional view showing a method of manufacturing the semiconductor device according to the third embodiment.
Figure 22B:
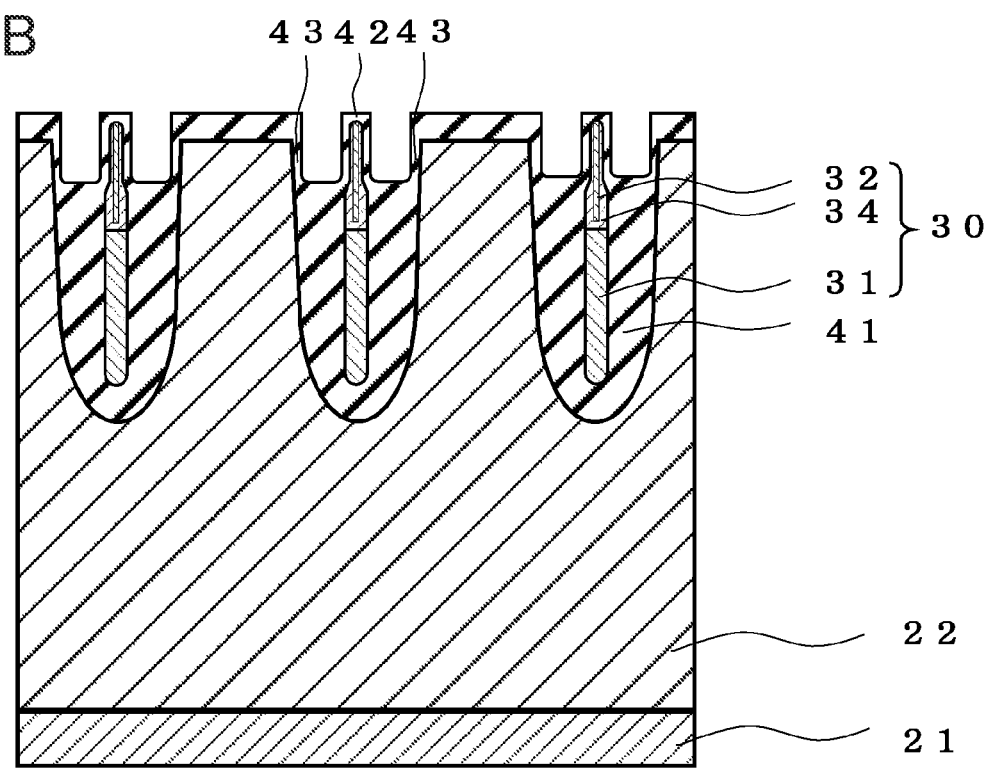
FIG. 22B is a cross-sectional view showing a method of manufacturing the semiconductor device according to the third embodiment.
Figure 23:
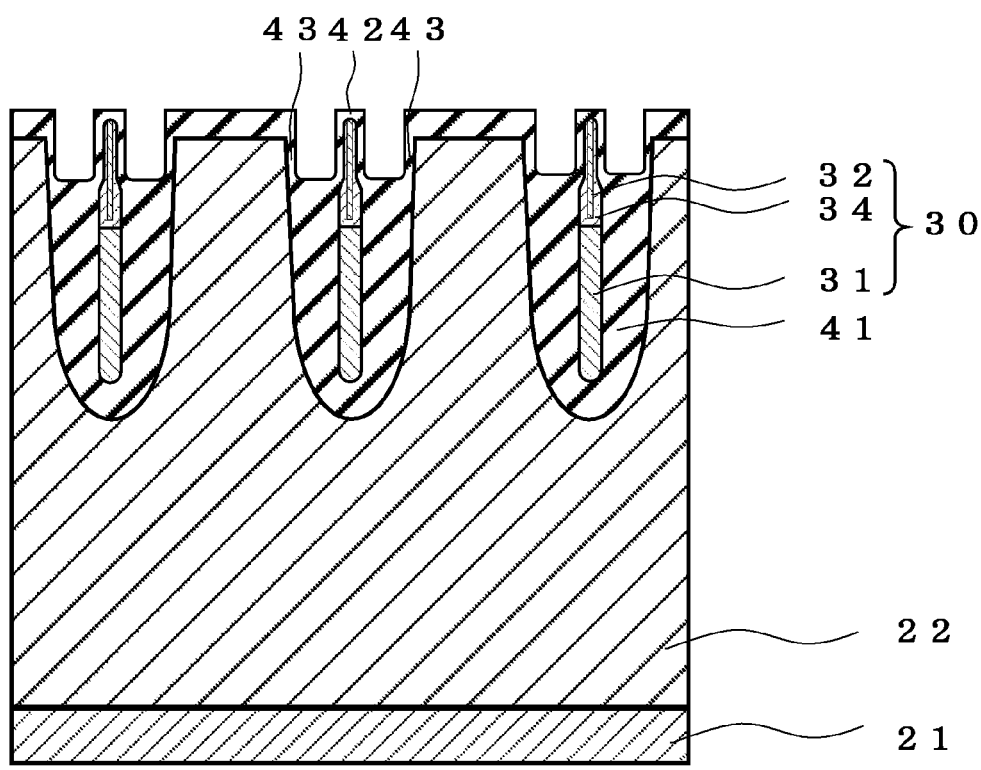
FIG. 23 is a cross-sectional view showing another method of manufacturing the semiconductor device according to the third embodiment.

FIG. 21A is a cross-sectional view showing a method of manufacturing the semiconductor device 300 according to the third embodiment, and FIG. 21B is a cross-sectional view showing a method of manufacturing the semiconductor device 300 according to the third embodiment. In addition, FIG. 22A is a cross-sectional view showing a method of manufacturing the semiconductor device 300 according to the third embodiment, and FIG. 22B is a cross-sectional view showing a method of manufacturing the semiconductor device 300 according to the third embodiment. In addition, FIG. 23 is a cross-sectional view showing another method of manufacturing the semiconductor device 300 according to the third embodiment. After forming the first conductive portion 31 as shown in FIG. 5A in the method of manufacturing the semiconductor device 100 according to the first embodiment, the conductive layer 32a is formed by the CVD method as shown in FIG. 21A. In addition, a conductive layer 34a is formed on the conductive layer 32a by the CVD method.

A part of the upper surface of the conductive layer 32a and a part of the upper surface of the conductive layer 34a are removed by chemical dry etching (CDE) or the like. As a result, as shown in FIG. 21B, the second conductive portion 32 and the fourth conductive portion 34 are formed. The conductive portion 30 formed by the first conductive portion 31, the second conductive portion 32, and the fourth conductive portion 34 is provided in each of the plurality of trenches T.

A part of the first insulating layer 41a is removed by wet etching or CDE, so that the upper surface of the first insulating layer 41a is recessed to form the first insulating portion 41. As a result, as shown in FIG. 22A, the upper portion of the second conductive portion 32 including the upper surface and the side surface, the upper portion of the fourth conductive portion 34, and the upper surface of the n⁻-type semiconductor region 22 are exposed. The side surface of the n⁻-type semiconductor region 22 is exposed to the inner wall of the trench T.

The upper surface and the side surface of the n⁻-type semiconductor region 22 and the upper surface and the side surface of the second conductive portion 32 are oxidized by oxidation treatment. As shown in FIG. 22B, the second insulating portion 42 is formed by oxidizing a part of the second conductive portion 32 and a part of the fourth conductive portion 34. In addition, a part of the second conductive portion 32 that has not been oxidized and the fourth conductive portion 34 are formed.

The fourth conductive portion 34 may be formed widely in the X direction by injecting impurities into the second conductive portion 32. In this case, in the method of manufacturing the semiconductor device 200 according to the second embodiment, as shown in FIG. 16B, a part of the fourth insulating layer 44a formed on the second conductive portion 32 and the fourth conductive portion 34 is removed to form the second opening OP2. Thereafter, as shown in FIG. 23, by injecting impurities into the second conductive portion 32 and the fourth conductive portion 34 through the second opening OP2, the fourth conductive portion 34 in a portion electrically connected to the source electrode 14 can be formed to be large.

The semiconductor device 300 according to the third embodiment has the same structure as the semiconductor device 200 according to the second embodiment except for the points described above. In addition, the method of manufacturing the semiconductor device 300 is the same as the method of manufacturing the semiconductor device 200 except for the points described above.

In the semiconductor device 300 according to the third embodiment, the upper portion of the fourth conductive portion 34 and the source electrode 14 are directly connected to each other in the Z direction, similarly to the semiconductor device 200 according to the second embodiment. Therefore, in the semiconductor device 300 according to the third embodiment, since it is not necessary to provide the source contact portion 51, the effective area through which a current flows during the ON operation can be increased. As a result, it is possible to reduce the on-resistance.

In addition, in the semiconductor device 300 according to the third embodiment, the second conductive portion 32 having a lower impurity concentration than the fourth conductive portion 34 is provided between the fourth conductive portion 34 and the gate electrode 13 and between the fourth conductive portion 34 and the second insulating portion 42 in the X direction. For this reason, it is possible to further suppress the variation in the grain size of the polysilicon of the second conductive portion 32. Therefore, it is possible to further suppress the variation in the film thickness of the second insulating portion 42 formed by oxidizing a part of the second conductive portion 32. As a result, in the semiconductor device 300, it is possible to maintain the breakdown tolerance of the insulating film between the gate electrode 13 and the conductive portion 30 and reduce the on-resistance.

While certain embodiments have been described, these embodiments have been presented by way of example only, and are not intended to limit the scope of the inventions. Indeed, the semiconductor device and the method of manufacturing a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first electrode;
a second electrode;
a first semiconductor region of a first conductive type provided between the first electrode and the second electrode and electrically connected to the first electrode;
a plurality of second semiconductor regions of a second conductive type provided between the first semiconductor region and the second electrode;
a third semiconductor region of the first conductive type provided between the second semiconductor region and the second electrode and electrically connected to the second electrode;
a conductive portion provided between the first electrode and the second electrode, the conductive portion including a first conductive portion and a second conductive portion, the first conductive portion provided on a side of the conductive portion facing the first electrode in a first direction from the first electrode to the first semiconductor region, the second conductive portion provided on a side of the conductive portion facing the second electrode in the first direction, the second conductive portion disposed between the second semiconductor regions in a second direction crossing the first direction, and the second conductive portion having an impurity concentration lower than an impurity concentration of the first conductive portion;
a first insulating portion provided between the first conductive portion and the first semiconductor region;
a gate electrode provided between the second semiconductor region and the second conductive portion in the second direction;
a second insulating portion provided between the second conductive portion and the gate electrode; and
a third insulating portion provided between the second semiconductor region and the gate electrode.

2. The semiconductor device according to claim 1, wherein the semiconductor device includes an element region and a termination region surrounding the element region, and the second electrode and the first conductive portion are connected to each other in the termination region.

3. The semiconductor device according to claim 1, further comprising:
a fourth insulating portion provided between the second electrode and the gate electrode and between the second electrode and the third semiconductor region,
wherein the second electrode includes a part, the fourth insulating portion is interposed between the part of the second electrode and the third semiconductor region in the second direction, and the part of the second electrode is connected to the second conductive portion.

4. The semiconductor device according to claim 3,
wherein a boundary between the part of the second electrode and the second conductive portion is provided closer to the first electrode than a boundary between the fourth insulating portion and the gate electrode in the first direction.

5. The semiconductor device according to claim 3,
wherein the conductive portion further includes a fourth conductive portion having an impurity concentration higher than the impurity concentration of the second conductive portion,
the fourth conductive portion is connected to the second electrode, and
the second conductive portion is provided between the second insulating portion and the fourth conductive portion in the second direction.

6. The semiconductor device according to claim 5,
wherein the second conductive portion extends in the first direction so as to have a portion adjacent to the first insulating portion, and
a width in the second direction of the second conductive portion adjacent to the first insulating portion is larger than a width in the second direction of the second conductive portion adjacent to the second insulating portion.

7. The semiconductor device according to claim 1,
wherein the semiconductor device includes an element region and a termination region surrounding the element region, and
the second electrode and the second conductive portion are connected to each other in the element region.

8. The semiconductor device according to claim 1,
wherein the conductive portion further includes a third conductive portion,
a part of the second conductive portion on the first electrode side in the first direction is adjacent to the first insulating portion, and
the third conductive portion provided between the part of the second conductive portion and the first insulating portion.

9. The semiconductor device according to claim 8,
wherein a sum of widths in the second direction of the second conductive portion and the third conductive portion is larger than a width in the second direction of the second conductive portion between the gate electrodes.

10. The semiconductor device according to claim 1,
wherein a concentration of impurities contained in the second insulating portion is higher than a concentration of impurities contained in the first insulating portion or the third insulating portion.

11. A method of manufacturing a semiconductor device, comprising:
forming a trench in a first semiconductor region of a first conductive type from a surface of the first semiconductor region in a first direction;
forming a first insulating portion on a surface of the trench;
forming a first conductive portion on the first insulating portion in the trench;
forming a second conductive portion in contact with the first conductive portion and having an impurity concentration lower than an impurity concentration of the first conductive portion, the first conductive portion being disposed between the first insulating portion and the second conductive portion in the first direction;
removing a part of the first insulating portion to expose a part of the second conductive portion and a part of an inner wall of the trench in a second direction crossing the first direction;
forming a second insulating portion by oxidizing a surface of the second conductive portion;
forming a third insulating portion by oxidizing the inner wall of the exposed trench;
forming a gate electrode between the second insulating portion and the third insulating portion;
forming a second semiconductor region of a second conductive type facing the gate electrode in the first semiconductor region, the third insulating portion interposed between the second semiconductor region and the gate electrode in the second direction; and
forming a third semiconductor region of the first conductive type between the surface and the second semiconductor region.

12. The method of manufacturing a semiconductor device according to claim 11,
wherein the second conductive portion is formed of polysilicon, and the second insulating portion is formed by thermally oxidizing the second conductive portion.

* * * * *